United States Patent
Sole Rojals et al.

(10) Patent No.: US 9,871,537 B2
(45) Date of Patent: Jan. 16, 2018

(54) MAPPING STATES IN BINARY ARITHMETIC CODER FOR VIDEO CODING

(71) Applicant: Qualcomm Incorporated, San Diego, CA (US)

(72) Inventors: Joel Sole Rojals, La Jolla, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 777 days.

(21) Appl. No.: 13/660,540

(22) Filed: Oct. 25, 2012

(65) Prior Publication Data

US 2013/0107951 A1    May 2, 2013

Related U.S. Application Data

(60) Provisional application No. 61/552,426, filed on Oct. 27, 2011.

(51) Int. Cl.
| | |
|---|---|
| *H04N 19/13* | (2014.01) |
| *H03M 7/42* | (2006.01) |
| *H03M 7/40* | (2006.01) |
| *H04N 19/91* | (2014.01) |
| *H04N 19/61* | (2014.01) |

(52) U.S. Cl.
CPC .......... *H03M 7/42* (2013.01); *H03M 7/4018* (2013.01); *H04N 19/13* (2014.11); *H04N 19/91* (2014.11); *H04N 19/61* (2014.11)

(58) Field of Classification Search
None
See application file for complete search history.

(56) References Cited

U.S. PATENT DOCUMENTS

| | | | |
|---|---|---|---|
| 6,943,710 B2 | 9/2005 | Marpe et al. | |
| 7,206,448 B2 | 4/2007 | Howard | |
| 7,595,743 B1 | 9/2009 | Winger et al. | |
| 7,714,753 B2 | 5/2010 | Lu | |
| 7,808,406 B2 | 10/2010 | He et al. | |
| 2002/0136319 A1* | 9/2002 | Olszewski | 375/261 |

(Continued)

FOREIGN PATENT DOCUMENTS

| | | |
|---|---|---|
| CN | 101014124 A | 8/2007 |
| CN | 101198051 A | 6/2008 |

(Continued)

OTHER PUBLICATIONS

Marpe et al., "Context-Based Adaptive Binary Arithmetic Coding in the H.264/AVC Video Compression Standard," IEEE Transactions on Circuits and Systems for Video Technology, vol. 13, No. 7, Jul. 2003.*

(Continued)

*Primary Examiner* — William C Vaughn, Jr.
*Assistant Examiner* — Michael J Hess

(57) ABSTRACT

This disclosure describes techniques for binary arithmetic coding in video coding, and video encoders and decoders for performing such techniques. In some examples, the techniques may support binary arithmetic coding that supports slower adaptation rates and accounts more extreme probabilities (i.e., probabilities closer to 0 and 1) while maintaining relatively small tables.

20 Claims, 8 Drawing Sheets

(56) References Cited

U.S. PATENT DOCUMENTS

2009/0079602 A1    3/2009    Sze et al.
2009/0219183 A1    9/2009    Sakaguchi

FOREIGN PATENT DOCUMENTS

JP           2014522613 A    9/2014
WO        2012172113 A1    12/2012

OTHER PUBLICATIONS

Marpe et al., "Novel Entropy Coding Concept," JCTVC-A032, Dresden, DE, Apr. 2010.*

Bross et al., "High efficiency video coding (HEVC) text specification draft 6," 8th Meeting: San Jose, CA, USA, Feb. 1-10, 2012, JCTVC-H1003, 259 pp.

International Search Report and Written Opinion—PCT/US2012/062087—ISA/EPO—Mar. 7, 2013, 15 pp.

Marpe, et al., "Context-based adaptive binary arithmetic coding in JVT/H.26L," International Conference on Image Processing (ICIP), Sep. 22, 2002, pp. 513-516, vol. 2, XP010608021, ISBN: 978-0-7803-7622-9, 4 pp.

"Partition (database)—Wikipedia, the free encyclopedia," Sep. 23, 2011, XP055054202, 3 pp.

Sole et al., "CE1: Modified LPS range and state transition tables for BAC," 8th JCTVC Meeting; San Jose, CA, 99 MPEG Meeting; Jan. 2, 2012-Oct. 2, 2012; (Joint Collaborative Team on Video Coding of ITU-T SG.16 WP3 and ISO/IEC JTC1/SC29/WG11) <URL: http://wftp3.itu.int/av-arch/jctvc-site/> No. JCTVC-H0444, XP030111471, 6 pp.

Bross et al., "High efficiency video coding (HEVC) text specification draft 9," 11th Meeting: Shanghai, CN, Oct. 10-19, 2012, JCTVC-K1003_v7, 290 pp.

Bross et al., "High efficiency video coding (HEVC) text specification draft 10 (for FDIS & Last Call)," 12th Meeting: Geneva, CH, Jan. 14-23, 2013, JCTVC-L1003_v34, 310 pp.

ITU-T H.265, Series H: Audiovisual and Multimedia Systems, Infrastructure of audiovisual services—Coding of moving video, Advanced video coding for generic audiovisual services, The International Telecommunication Union. Apr. 2013, 317 pp.

Second Written Opinion from International Application No. PCT/US2012/062087, dated Nov. 6, 2013, 9 pp.

International Preliminary Report on Patentability from International Application No. PCT/US2012/062087, dated Feb. 14, 2014, 11 pp.

Wiegand et al., "WD1: Working Draft 1 of High-Efficiency Video Coding", JCTVC-C403, 3rd Meeting: Guangzhou, CN, Oct. 7-15, 2010, 137 pp.

Wiegand et al., "WD2: Working Draft 2 of High-Efficiency Video Coding," JCTVC-D503, Jan. 20-28, 2011, 153 pp.

Wiegand et al., "WD3: Working Draft 3 of High-Efficiency Video Coding," Document JCTVC-E603, 5th Meeting: Geneva, CH, Mar. 16-23, 2011,193 pp.

Bross et al., "WD4: Working Draft 4 of High-Efficiency Video Coding," 6th Meeting: JCTVC-F803_d2, Torino, IT, Jul. 14-22, 2011, 226 pp.

Bross et al., "WD5: Working Draft 5 of High-Efficiency Video Coding," 7th Meeting: Geneva, Switzerland, Nov. 2011, JCTVC-G1103_d2, 214 pp.

ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.

Marpe et al., "Context-based adaptive binary arithmetic coding in the H.264/AVC video compression standard," IEEE Transactions on Circuits and Systems for Video Technology, Jul. 2003, vol. 13 (7), pp. 620-636

Bross et al., "High efficiency video coding (HEVC) text specification draft 6," 7th Meeting: Geneva, CH, Nov. 21-30, 2011, JCTVC-H1003, 259 pp.

Bross et al., "High efficiency video coding (HEVC) text specification draft 7," 9th Meeting: Geneva, CH, Apr. 27-May 7, 2012, JCTVC-I1003_d21, 290 pp.

Bross et al., "High efficiency video coding (HEVC) text specification draft 8," 10th Meeting: Stockholm, SE, Jul. 11-20, 2012, JCTVC-J1003_d7, 261 pp.

Chuang et al., "CABAC with a Reduced LPS Range Table," Joint Collaborative Team on Video Coding (JCT-VC) of ITU-T SG16 WP3 and ISO/IEC JTC1/SC29/WG11, 6th Meeting: Torino, IT, Jul. 14-22, 2011, JCTVC-F061, pp. 1-5.

Marpe et al., "Unified PIPE-Based Entropy Coding for HEVC," JCT-VC Meeting; MPEG Meeting; Jul. 14-22, 2011; Torino, IT; (Joint Collaborative Team on Video Coding of ITU-T SG16 WP3 and ISO/IEC JTC1/SC29/WG11); URL:http://wftp3.itu.int/av-arch/jctvc-site/,No. JCTVC-F268, XP030009291, 16 pp.

Sole et al., "CE1: Modified LPS range and state transition tables for BAC," Joint Collaborative Team on Video Coding (JCT-VC) of ITU-T SG16 WP3 and ISO/IEC JTC1/SC29/WG11, 8th Meeting: San Jose, CA, USA, Feb. 1-10, 2012, JCTVC-H0444, pp. 1-8.

Sole et al., "Modified LPS range and state transition tables for BAC," Joint Collaborative Team on Video Coding (JCT-VC) of ITU-T SG16 WP3 and ISO/IEC JTC1/SC29/WG11, 7th Meeting: Geneva, CH, Nov. 21-30, 2011, JCTVC-G324, pp. 1-9.

Zhu, "Arithmetic coding based on probability-aggregation and delayed-subdivision," Joint Collaborative Team on Video Coding (JCT-VC) of ITU-T SG16 WP3 and ISO/IEC JTC1/SC29/WG11, 1st Meeting: Dresden, DE, Apr. 15-23, 2010, JCTVC-A027, pp. 1-6.

* cited by examiner

MAPPING STATES IN BINARY ARITHMETIC CODER FOR VIDEO CODING

This application claims the benefit of U.S. Provisional Application No. 61/552,426, filed Oct. 27, 2011, the entire content of which is incorporated herein by reference.

TECHNICAL FIELD

This disclosure relates to video coding and, more particularly, to techniques for binary arithmetic coding of video data.

BACKGROUND

Digital video capabilities can be incorporated into a wide range of devices, including digital televisions, digital direct broadcast systems, wireless broadcast systems, personal digital assistants (PDAs), laptop or desktop computers, digital cameras, digital recording devices, digital media players, video gaming devices, video game consoles, cellular or satellite radio telephones, video teleconferencing devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards, to transmit, receive and store digital video information more efficiently.

Video compression techniques include spatial prediction and/or temporal prediction to reduce or remove redundancy inherent in video sequences. For block-based video coding, a video frame or slice may be partitioned into blocks. Each block can be further partitioned. Blocks in an intra-coded (I) frame or slice are encoded using spatial prediction with respect to reference samples in neighboring blocks in the same frame or slice. Blocks in an inter-coded (P or B) frame or slice may use spatial prediction with respect to reference samples in neighboring blocks in the same frame or slice or temporal prediction with respect to reference samples in other reference frames. Spatial or temporal prediction results in a predictive block for a block to be coded. Residual data represents pixel differences between the original block to be coded and the predictive block.

An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in a particular order to produce a one-dimensional vector of transform coefficients for entropy coding.

Various entropy coding processes may used to code residual transform coefficients, motion vector information, syntax elements, and other associated information. Examples of various entropy coding and other data compression processes include context-adaptive variable length coding (CAVLC), context-adaptive binary arithmetic coding (CABAC), probability interval partitioning entropy coding (PIPE), Golomb coding, Golomb-Rice coding, and exponential Golomb coding.

SUMMARY

In general, this disclosure describes techniques for binary arithmetic coding in video coding, and video encoders and decoders for performing such techniques. In some examples, the techniques may support binary arithmetic coding that delivers slower adaptation rates and accounts more extreme probabilities (i.e., probabilities closer to 0 and 1) while maintaining relatively small tables.

The techniques may include the use of an increased number of probability states so that a table can provide slower adaptation and lower probabilities. In some examples, the value of a highest probability ($p_0$) can be modified, e.g., to be lower than ½.

In another example, to avoid a large increase in the number of states in a range table, the techniques of this disclosure may include mapping indexes indicating the probability states to a lower size (i.e., a fewer number of indexes) than used in other conventional techniques in order to index the range of least probable symbols (LPS).

In some examples, the probability state index may be divided by two to generate a new index, and the new index can be used as an entry for a range LPS table. In this case, instead of using a probability state $\sigma$ to index the entry in the range LPS table, the techniques may employ ($\sigma \gg 1$), i.e., the state divided by two and rounded to the lower integer.

The grouping of the state indexes can be described with a table, going from an initial number of probability state indexes to a reduced number of probability state indexes (grouped states indexes). The use of this kind of table may enhance performance (compared to the division or right shifting), at the cost of additional memory, thereby presenting a desirable design trade-off between memory and performance.

Although a linear mapping of probability states indexes to entries in the range LPS table may be used, it also may be desirable to provide a nonlinear mapping. For example, the probability states indexes may be mapped according to a logarithmic mapping. A logarithmic mapping may be achieved, in some examples, using piecewise linear mapping. In general, a logarithmic or other mapping may be defined using a table, such as a precomputed mapping table, or possibly via application of one or more mathematical formulas in other examples.

In one example, the disclosure describes a method of entropy coding of video data using a binary arithmetic coding process in a video coding process. The method comprises determining a probability state of symbols in a binary arithmetic coding process, wherein the probability state comprises one of a plurality of probability states, and mapping an index indicating the determined probability state to one of a plurality of grouped indexes, wherein at least one of the grouped indexes represents at least two of the plurality of probability states, and wherein each of the grouped indexes identifies a range for a probability symbol in a table.

In another example, the disclosure describes an apparatus configured to entropy code video data using a binary arithmetic coding process in a video coding process. The apparatus comprises means for determining a probability state of symbols in a binary arithmetic coding process, wherein the probability state comprises one of a plurality of probability states, and means for mapping an index indicating the determined probability state to one of a plurality of grouped indexes, wherein at least one of the grouped indexes represents at least two of the plurality of probability states, and wherein each of the grouped indexes identifies a range for a probability symbol in a table.

In another example, the disclosure describes an apparatus configured to entropy code video data using a binary arithmetic coding process in a video coding process. The apparatus comprises a video coder configured to determine a probability state of symbols in a binary arithmetic coding process, wherein the probability state comprises one of a plurality of probability states, and to map an index indicating the determined probability state to one of a plurality of grouped indexes, wherein at least one of the grouped indexes represents at least two of the plurality of probability states, and wherein each of the grouped indexes identifies a range for a probability symbol in a table.

In another example, the disclosure describes a computer-readable storage medium storing instructions that, when executed, causes one or more processors to entropy code video data using a binary arithmetic coding process in a video coding process. The instructions causing the one or more processors to determine a probability state of symbols in a binary arithmetic coding process, wherein the probability state comprises one of a plurality of probability states, and to map an index indicating the determined probability state to one of a plurality of grouped indexes, wherein at least one of the grouped indexes represents at least two of the plurality of probability states, and wherein each of the grouped indexes identifies a range for a probability symbol in a table.

The details of one or more examples are set forth in the accompanying drawings and the description below. Other features, objects, and advantages will be apparent from the description and drawings, and from the claims.

DETAILED DESCRIPTION

Figure 1:
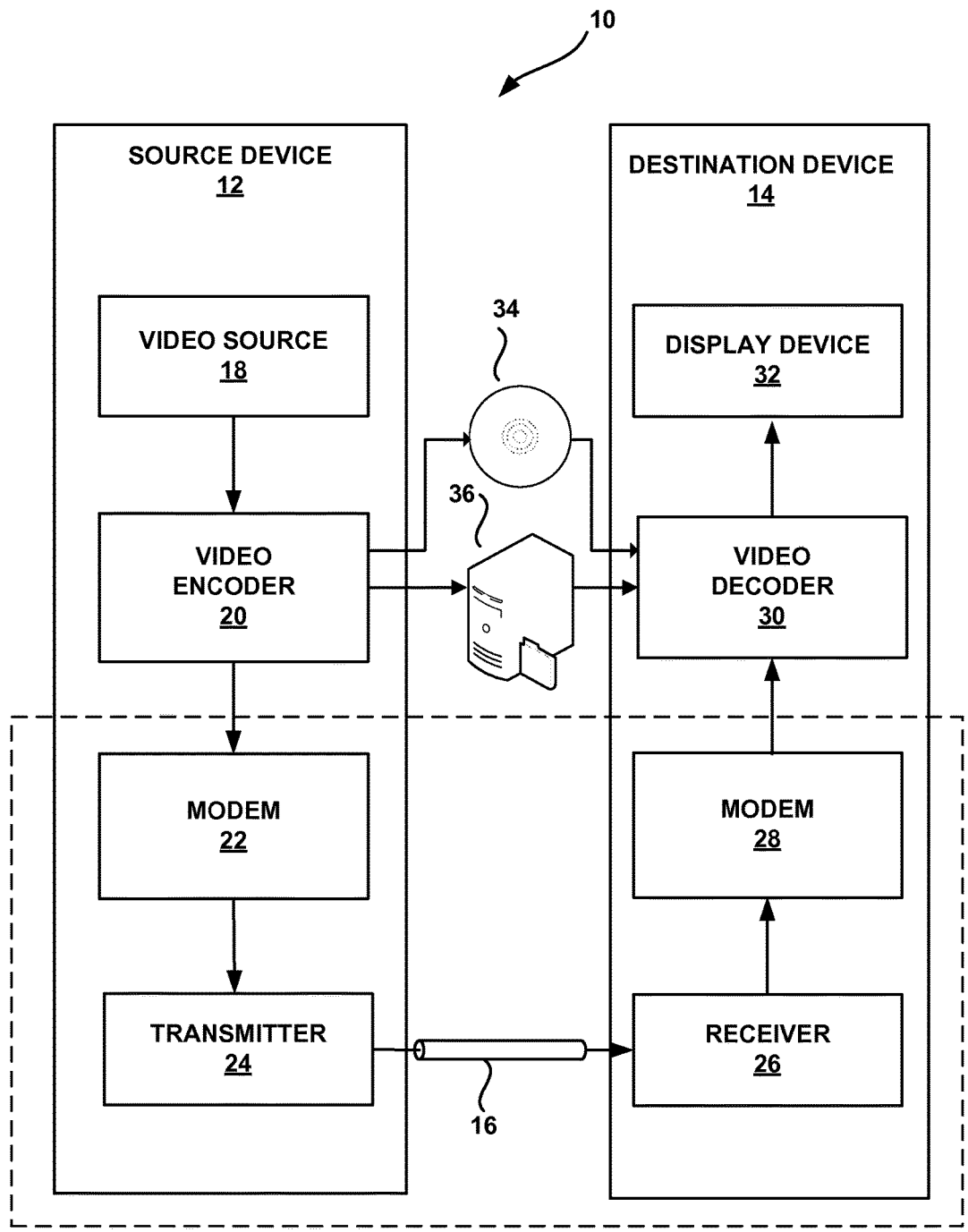
FIG. 1 is a block diagram illustrating an example video encoding and decoding system.

This disclosure describes techniques for binary arithmetic coding (BAC). In one or more examples, the techniques of this disclosure may be used in a context adaptive binary arithmetic coding (CABAC) process during video coding. For example, such techniques may be performed in video encoders and decoders configured to perform such techniques. The coding techniques described in this disclosure also may be applicable to other types of data coding. In this disclosure, however, video coding will be described for purposes of illustration.

One problem with previously-used BAC approaches, including BAC approaches used in H.264/AVC (advanced video coding) and BAC proposals for the newly emerging High-Efficiency Video Coding (HEVC) standard, is that certain tables used in such BAC approaches are tuned for low resolution videos (e.g., common intermediate format (CIF) and quarter-CIF (QCIF) videos). Currently, a large amount of video content is high definition (HD) and, in some cases, greater than HD, such as extra-HD, so-called 2K, 2160p, 2540p, 4K, 4320p, or even higher resolutions. Video content that is HD or greater than HD has different statistics than the 10-years-old QCIF sequences used to develop BAC for H.264/AVC.

As such, certain tables used for BAC may benefit from modifications that can account for the characteristics of this new content (e.g., HD or extra-HD content). The prevalence of HD content applies implies that BAC should be different in at least two aspects:

1. BAC should have a slower adaptation process; and
2. BAC should account for more extreme cases (skewed probabilities).

This disclosure proposes solutions to current BAC problems. In various examples, this disclosure proposes to modify BAC tables so as to attain slower adaptation and account for more skewed probabilities, while keeping the table sizes at a practical level. In other words, this disclosure describes techniques to achieve slower adaptation and to account for more extreme probabilities (i.e., probabilities closer to 0 and 1) while using relatively small-sized tables.

Digital video devices implement video compression techniques to encode and decode digital video information more efficiently. Video compression may apply spatial (intra-frame) prediction and/or temporal (inter-frame) prediction techniques to reduce or remove redundancy inherent in video sequences.

There is a new video coding standard, namely High-Efficiency Video Coding (HEVC), being developed by the Joint Collaboration Team on Video Coding (JCT-VC) of ITU-T Video Coding Experts Group (VCEG) and ISO/IEC Motion Picture Experts Group (MPEG). A recent draft of the HEVC standard, referred to as "HEVC Working Draft 8" or "WD8," is described in document JCTVC-J1003, Bross et al., "High efficiency video coding (HEVC) text specification draft 6," Joint Collaborative Team on Video Coding (JCT-VC) of ITU-T SG16 WP3 and ISO/IEC JTC1/SC29/WG11, 10th Meeting: Stockholm, SE, 11-20 Jul. 2012, which, as of Oct. 25, 2012, is downloadable from http://phenix.int-evry.fr/jct/doc_end_user/documents/10_Stockholm/wg11/JCTVC-J1003-v8.zip.

For video coding according to HEVC, as one example, a video frame may be partitioned into coding units. A coding unit (CU) generally refers to an image region that serves as a basic unit to which various coding tools are applied for video compression. A CU usually has a luminance component, which may be denoted as Y, and two chroma components, which may be denoted as Cr and Cb. Depending on the video sampling format, the size of the Cr and Cb components, in terms of number of samples, may be the same as or different from the size of the Y component. A CU is typically square, and may be considered to be similar to a so-called macroblock, e.g., under other video coding standards such as ITU-T H.264.

The luma and chroma components of pixels in a CU may be coded in different sub-sampling formats. In one proposal for HEVC, the luma and chroma components of a pixel are coded in a 4:2:0 format. In a 4:2:0 pixel format, for every 4×2 block of pixels, there are eight luma components (4 in each row) and 2 chroma components (e.g., 1 Cr chroma component and 1 Cb chroma component in the first row of the 4×2 block). The second row of the 4×2 block would have no chroma information. As such, in a 4×2 block of pixels, the chroma components are sampled at ½ horizontal resolution and ½ vertical resolution. However, video coding techniques are not limited to 4:2:0 chroma sub-sampling. Other sub-sampling formats may be used, including 4:2:2 and 4:4:4. In a 4:2:2 pixel format, for every 4×2 block of pixels, there are eight luma components (4 in each row) and 4 chroma components (e.g., 1 Cr chroma component and 1 Cb chroma component in each of the first and second row of the 4×2 block). As such, for a 4:2:2 format, the chroma components are sampled at ½ horizontal resolution and full vertical resolution. The 4:4:4 pixel format involves no sub-sampling of chroma components. That is, for a 4×2 block of pixels, there are eight luma components, eight Cr components, and eight Cb components. These or other sampling formats could be used.

To achieve better coding efficiency, a coding unit may have variable sizes depending on video content. In addition, a coding unit may be split into smaller blocks for prediction or transform. In particular, each coding unit may be further partitioned into prediction units (PUs) and transform units (TUs). PUs may be considered to be similar to so-called partitions under other video coding standards, such as H.264. TUs refer to blocks of residual data to which a transform is applied to produce transform coefficients.

Coding according to some of the presently proposed aspects of the developing HEVC standard will be described in this application for purposes of illustration. However, the techniques described in this disclosure may be useful for other video coding processes, such as those defined according to H.264 or other standard or proprietary video coding processes.

HEVC standardization efforts are based on a model of a video coding device referred to as the HEVC Test Model (HM). The HM presumes several capabilities of video coding devices over devices according to, e.g., ITU-T H.264/AVC. For example, whereas H.264 provides nine intra-prediction encoding modes, HM provides as many as thirty-five intra-prediction encoding modes.

According to the HM, a CU may include one or more prediction units (PUs) and/or one or more transform units (TUs). Syntax data within a bitstream may define a largest coding unit (LCU), which is a largest CU in terms of the number of pixels. In general, a CU has a similar purpose to a macroblock of H.264, except that a CU does not have a size distinction. Thus, a CU may be split into sub-CUs. In general, references in this disclosure to a CU may refer to a largest coding unit of a picture or a sub-CU of an LCU. An LCU may be split into sub-CUs, and each sub-CU may be further split into sub-CUs. Syntax data for a bitstream may define a maximum number of times an LCU may be split, referred to as CU depth. Accordingly, a bitstream may also define a smallest coding unit (SCU). This disclosure also uses the term "block", "partition," or "portion" to refer to any of a CU, PU, or TU. In general, "portion" may refer to any sub-set of a video frame.

An LCU may be associated with a quadtree data structure. In general, a quadtree data structure includes one node per CU, where a root node corresponds to the LCU. If a CU is split into four sub-CUs, the node corresponding to the CU includes four leaf nodes, each of which corresponds to one of the sub-CUs. Each node of the quadtree data structure may provide syntax data for the corresponding CU. For example, a node in the quadtree may include a split flag, indicating whether the CU corresponding to the node is split into sub-CUs. Syntax elements for a CU may be defined recursively, and may depend on whether the CU is split into sub-CUs. If a CU is not split further, it is referred as a leaf-CU.

Moreover, TUs of leaf-CUs may also be associated with respective quadtree data structures. That is, a leaf-CU may include a quadtree indicating how the leaf-CU is partitioned into TUs. This disclosure refers to the quadtree indicating how an LCU is partitioned as a CU quadtree and the quadtree indicating how a leaf-CU is partitioned into TUs as a TU quadtree. The root node of a TU quadtree generally corresponds to a leaf-CU, while the root node of a CU quadtree generally corresponds to an LCU. TUs of the TU quadtree that are not split are referred to as leaf-TUs.

A leaf-CU may include one or more prediction units (PUs). In general, a PU represents all or a portion of the corresponding CU, and may include data for retrieving a reference sample for the PU. For example, when the PU is inter-mode encoded, the PU may include data defining a motion vector for the PU. The data defining the motion vector may describe, for example, a horizontal component of the motion vector, a vertical component of the motion vector, a resolution for the motion vector (e.g., one-quarter pixel precision or one-eighth pixel precision), a reference frame to which the motion vector points, and/or a reference list (e.g., list 0 or list 1) for the motion vector. Data for the leaf-CU defining the PU(s) may also describe, for example, partitioning of the CU into one or more PUs. Partitioning modes may differ depending on whether the CU is not predictively coded, intra-prediction mode encoded, or inter-prediction mode encoded. For intra coding, a PU may be treated the same as a leaf transform unit described below.

To code a block (e.g., a prediction unit (PU) of video data), a predictor for the block is first derived. The predictor can be derived either through intra (I) prediction (i.e. spatial prediction) or inter (P or B) prediction (i.e. temporal prediction). Hence, some prediction units may be intra-coded (I) using spatial prediction with respect to neighbouring reference blocks in the same frame, and other prediction units may be inter-coded (P or B) with respect to reference blocks in other frames. The reference blocks used for prediction may include actual pixel values at so-called integer pixel positions as reference samples, or synthesized pixel values produced by interpolation at fractional pixel positions as reference samples.

Upon identification of a predictor, the difference between the original video data block and its predictor is calculated. This difference is also called the prediction residual, and refers to the pixel differences between the pixels of the block to be coded and corresponding reference samples (which may be integer-precision pixels or interpolated fractional-precision pixels, as mentioned above) of the reference block, i.e., predictor. To achieve better compression, the prediction residual (i.e., the array of pixel difference values) is generally transformed from the pixel (i.e., spatial) domain to a transform domain, e.g., using a discrete cosine transform (DCT), integer transform, Karhunen-Loeve (K-L) transform, wavelet transform, or other transform. The transform domain may be, for example, a frequency domain.

Coding a PU using inter-prediction involves calculating a motion vector between a current block and a block in a reference frame. Motion vectors are calculated through a process called motion estimation (or motion search). A motion vector, for example, may indicate the displacement of a prediction unit in a current frame relative to a reference sample of a reference frame. A reference sample may be a block that is found to closely match the portion of the CU including the PU being coded in terms of pixel difference, which may be determined by sum of absolute difference (SAD), sum of squared difference (SSD), or other difference metrics. The reference sample may occur anywhere within a reference frame or reference slice. In some examples, the reference sample may be interpolated, in whole or in part, and occur at a fractional pixel position. Upon finding a portion of the reference frame that best matches the current portion, the encoder determines the current motion vector for the current portion as the difference in the location from the current portion to the matching portion in the reference frame (e.g., from the center of the current portion to the center of the matching portion).

In some examples, an encoder may signal the motion vector for each portion in the encoded video bitstream. The signaled motion vector is used by the decoder to perform motion compensation in order to decode the video data. However, signaling the original motion vector directly may result in less efficient coding, as a large number of bits are typically needed to convey the information.

Once motion estimation is performed to determine a motion vector for a current portion, the encoder compares the matching portion in the reference frame to the current portion. This comparison typically involves subtracting the portion (which is commonly referred to as a "reference sample") in the reference frame from the current portion and results in so-called residual data, as mentioned above. The residual data indicates pixel difference values between the current portion and the reference sample. The encoder then transforms this residual data from the spatial domain to a transform domain, such as the frequency domain. Usually, the encoder applies a discrete cosine transform (DCT) to the residual data to accomplish this transformation. The encoder performs this transformation in order to facilitate the compression of the residual data because the resulting transform coefficients represent different frequencies, wherein the majority of energy is usually concentrated on a few low frequency coefficients.

Typically, the resulting transform coefficients are grouped together in a manner that enables entropy coding, especially if the transform coefficients are first quantized (rounded). The encoder then performs statistical lossless (or so-called "entropy") encoding to further compress the run-length coded quantized transform coefficients. After performing lossless entropy coding, the encoder generates a bitstream that includes the encoded video data. Examples of entropy coding includes CABAC, context adaptive variable length coding (CAVLC), probability interval partitioning entropy coding (PIPE), Golomb coding, Golomb-Rice coding, exponential Golomb coding, syntax-based context-adaptive binary arithmetic coding (SBAC), or other entropy coding methodologies.

FIG. 1 is a block diagram illustrating an example video encoding and decoding system 10 that may be configured to utilize techniques for BAC in a video coding process in accordance with examples of this disclosure. As shown in FIG. 1, system 10 includes source device 12 that transmits encoded video to destination device 14 via communication channel 16. Encoded video data may also be stored on storage medium 34 or file server 36 and may be accessed by destination device 14 as desired. When stored to a storage medium or file server, video encoder 20 may provide coded video data to another device, such as a network interface, a compact disc (CD), Blu-ray or digital video disc (DVD) burner or stamping facility device, or other devices, for storing the coded video data to the storage medium. Likewise, a device separate from video decoder 30, such as a network interface, CD or DVD reader, or the like, may retrieve coded video data from a storage medium and provided the retrieved data to video decoder 30.

Source device 12 and destination device 14 may comprise any of a wide variety of devices, including desktop computers, notebook (i.e., laptop) computers, tablet computers, set-top boxes, telephone handsets such as so-called smartphones, televisions, cameras, display devices, digital media players, video gaming consoles, or the like. In many cases, such devices may be equipped for wireless communication. Hence, communication channel 16 may comprise a wireless channel, a wired channel, or a combination of wireless and wired channels suitable for transmission of encoded video data. Similarly, file server 36 may be accessed by destination device 14 through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server.

Techniques for BAC in a video coding process, in accordance with examples of this disclosure, may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 1, source device 12 includes video source 18, video encoder 20, modulator/demodulator 22 and transmitter 24. In source device 12, video source 18 may include a source such as a video capture device, such as a video camera, a video archive containing previously captured video, a video feed interface to receive video from a video content provider, and/or a computer graphics system for generating computer graphics data as the source video, or a combination of such sources. As one example, if video source 18 is a video camera, source device 12 and destination device 14 may form so-called camera phones or video phones. However, the techniques described in this disclosure may be applicable to video coding in general, and may be applied to wireless and/or wired applications, or application in which encoded video data is stored on a local disk.

The captured, pre-captured, or computer-generated video may be encoded by video encoder 20. The encoded video information may be modulated by modem 22 according to a communication standard, such as a wireless communication protocol, and transmitted to destination device 14 via transmitter 24. Modem 22 may include various mixers, filters, amplifiers or other components designed for signal modulation. Transmitter 24 may include circuits designed for transmitting data, including amplifiers, filters, and one or more antennas.

The captured, pre-captured, or computer-generated video that is encoded by video encoder 20 may also be stored onto storage medium 34 or file server 36 for later consumption. Storage medium 34 may include Blu-ray discs, DVDs, CD-ROMs, flash memory, or any other suitable digital storage media for storing encoded video. The encoded video stored on storage medium 34 may then be accessed by destination device 14 for decoding and playback.

File server 36 may be any type of server capable of storing encoded video and transmitting that encoded video to destination device 14. Example file servers include a web server (e.g., for a website), an FTP server, network attached storage (NAS) devices, a local disk drive, or any other type of device capable of storing encoded video data and transmitting it to a destination device. The transmission of encoded video data from file server 36 may be a streaming transmission, a download transmission, or a combination of both. File server 36 may be accessed by destination device 14 through any standard data connection, including an Internet connection. This may include a wireless channel (e.g., a Wi-Fi connection), a wired connection (e.g., DSL, cable modem, Ethernet, USB, etc.), or a combination of both that is suitable for accessing encoded video data stored on a file server.

Destination device 14, in the example of FIG. 1, includes receiver 26, modem 28, video decoder 30, and display device 32. Receiver 26 of destination device 14 receives information over channel 16, and modem 28 demodulates the information to produce a demodulated bitstream for video decoder 30. The information communicated over channel 16 may include a variety of syntax information generated by video encoder 20 for use by video decoder 30 in decoding video data. Such syntax may also be included with the encoded video data stored on storage medium 34 or file server 36. Each of video encoder 20 and video decoder 30 may form part of a respective encoder-decoder (CODEC) that is capable of encoding or decoding video data.

Display device 32 may be integrated with, or external to, destination device 14. In some examples, destination device 14 may include an integrated display device and also be configured to interface with an external display device. In other examples, destination device 14 may be a display device. In general, display device 32 displays the decoded video data to a user, and may comprise any of a variety of display devices such as a liquid crystal display (LCD), a plasma display, an organic light emitting diode (OLED) display, or another type of display device.

In the example of FIG. 1, communication channel 16 may comprise any wireless or wired communication medium, such as a radio frequency (RF) spectrum or one or more physical transmission lines, or any combination of wireless and wired media. Communication channel 16 may form part of a packet-based network, such as a local area network, a wide-area network, or a global network such as the Internet. Communication channel 16 generally represents any suitable communication medium, or collection of different communication media, for transmitting video data from source device 12 to destination device 14, including any suitable combination of wired or wireless media. Communication channel 16 may include routers, switches, base stations, or any other equipment that may be useful to facilitate communication from source device 12 to destination device 14.

Video encoder 20 and video decoder 30 may operate according to a video compression standard, such as the HEVC standard presently under development, and may conform to the HEVC Test Model (HM). Alternatively, video encoder 20 and video decoder 30 may operate according to other proprietary or industry standards, such as the ITU-T H.264 standard, alternatively referred to as MPEG-4, Part 10, Advanced Video Coding (AVC), or extensions of such standards. The techniques of this disclosure, however, are not limited to any particular coding standard. Other examples include MPEG-2 and ITU-T H.263.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

Video encoder 20 may implement any or all of the techniques of this disclosure for BAC in a video coding process. Likewise, video decoder 30 may implement any or all of these techniques BAC in a video coding process. A video coder, as described in this disclosure, may refer to a video encoder or a video decoder. Similarly, a video coding unit may refer to a video encoder or a video decoder. In this context, a video coding unit is physical hardware and differs from the CU data structure discussed above. Likewise, video coding may refer to video encoding or video decoding.

In one example of the disclosure, video encoder 20 may be configured to determine a probability state of symbols in a binary arithmetic coding process, wherein the probability state comprises one of a plurality of probability states, and to map an index indicating the determined probability state to one of a plurality of grouped indexes, wherein at least one of the grouped indexes represents at least two of the plurality of probability states, and wherein each of the grouped indexes points to a range for a lowest probability symbol in a table.

Likewise, in another example of the disclosure, video decoder 30 may be configured to determine a probability state of symbols in a binary arithmetic coding process, wherein the probability state comprises one of a plurality of probability states, and to map an index indicating the determined probability state to one of a plurality of grouped indexes, wherein at least one of the grouped indexes represents at least two of the plurality of probability states, and wherein each of the grouped indexes points to a range for a lowest probability symbol in a table.

The following section will describe BAC and CABAC techniques in more detail. BAC, in general, is a recursive interval-subdividing procedure. BAC is used to encode bins in the CABAC process in the H.264/AVC video coding standard, and, currently, in the proposed HEVC video coding standard. The output of the BAC coder is a binary stream that represents a value or pointer to a probability within a final coded probability interval. The probability interval is specified by a range and a lower end value. Range is the extension of the probability interval. Low is the lower bound of the coding interval.

Application of arithmetic coding to video coding is described in D. Marpe, H. Schwarz, and T. Wiegand "Context-Based Adaptive Binary Arithmetic Coding in the H.264/AVC Video Compression Standard," IEEE Trans. Circuits and Systems for Video Technology, vol. 13, no. 7, July 2003, which is incorporated by reference herein. Each context (i.e., probability model) in CABAC is represented by a state. Each state ($\sigma$) implicitly represents a probability ($p_o$) of a particular symbol (e.g., a bin) being the Least Probable Symbol (LPS). A symbol can be an LPS or a Most Probable Symbol (MPS). Symbols are binary, and as such, the MPS and the LPS can be 0 or 1. The probability is estimated for the corresponding context and used (implicitly) to entropy code the symbol using the arithmetic coder.

The process of BAC is handled by a state machine that changes its internal values 'range' and 'low' depending on the context to code and the value of the bin being coded. Depending on the state of a context (that is, its probability), the range is divided into rangeMPS$_\sigma$(range of the most probable symbol in state σ) and rangeLPS$_\sigma$(range of the least probable symbol in state σ). In theory, the rangeLPS$_\sigma$value of a probability state σ is derived by a multiplication:

rangeLPS$_\sigma$=range ×p$_\sigma$, where p$_\sigma$ is the probability to select the LPS. Of course, the probability of MPS is 1−p$_\sigma$. Equivalently, the rangeMPS$_\sigma$ is equal to range minus rangeLPS$_\sigma$. BAC iteratively updates the range depending on the state of the context bin to code, the current range, and the value of the bin being coded (i.e., is the bin equal to the LPS or the MPS).

Figure 2A:
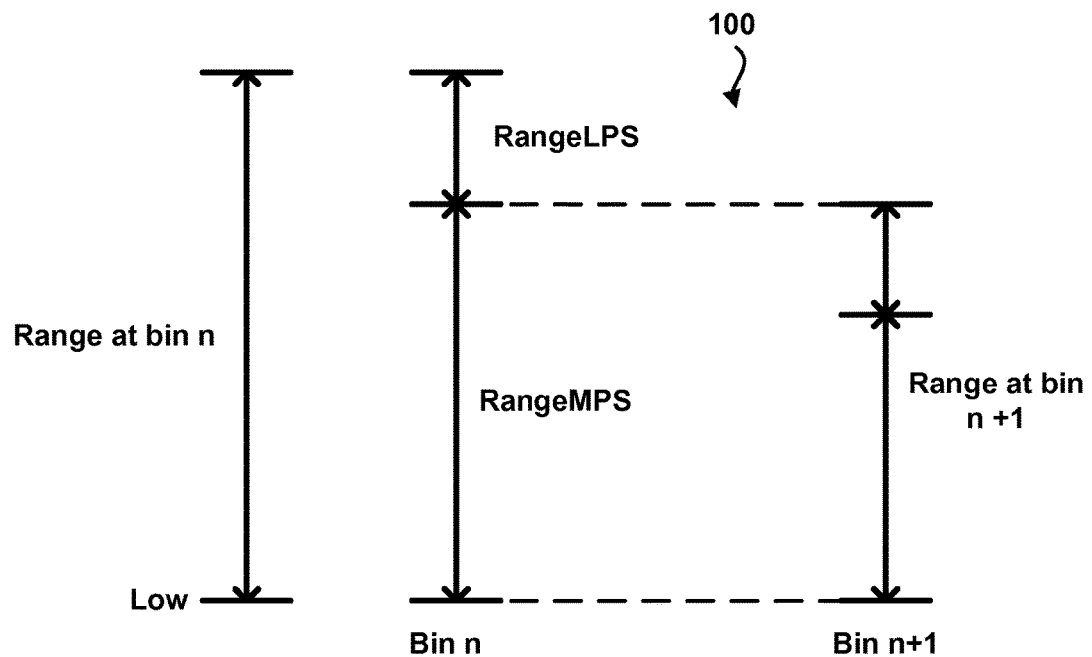
FIGS. 2A and 2B are conceptual diagrams illustrating a range update process in binary arithmetic coding.
Figure 2B:
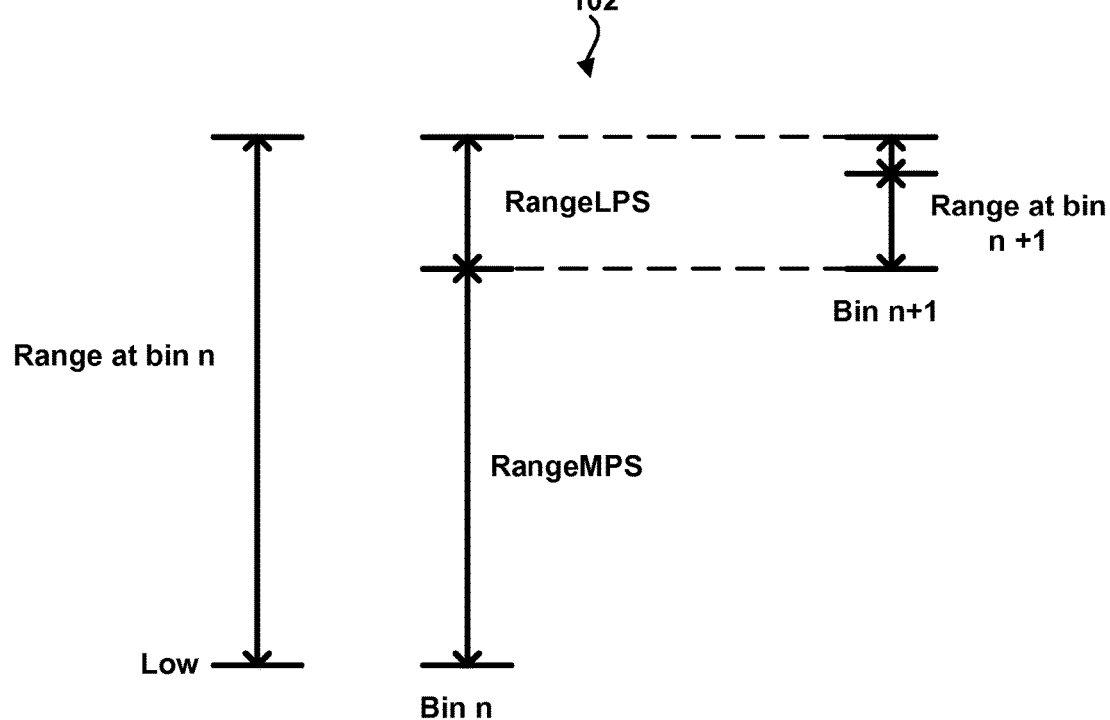

FIGS. 2A and 2B shows examples of this process at bin n. In example 100 of FIG. 2A, at bin N the range at bin 2 includes the RangeMPS and RangeLPS given by the probability of the LPS (p$_\sigma$) given a certain context state (σ). Example 100 shows the update of the range at bin n+1 when the value of bin n is equal to the MPS. In this example, the low stays the same, but the value of the range at bin n+1 is reduced to the value of RangeMPS at bin n. Example 102 of FIG. 2B shows the update of the range at bin n+1 when the value of bin n is not equal to the MPS (i.e., equal to the LPS). In this example, the low is moved to the lower range value of RangeLPS at bin n. In addition, the value of the range at bin n+1 is reduced to the value of RangeLPS at bin n.

Figure 3:
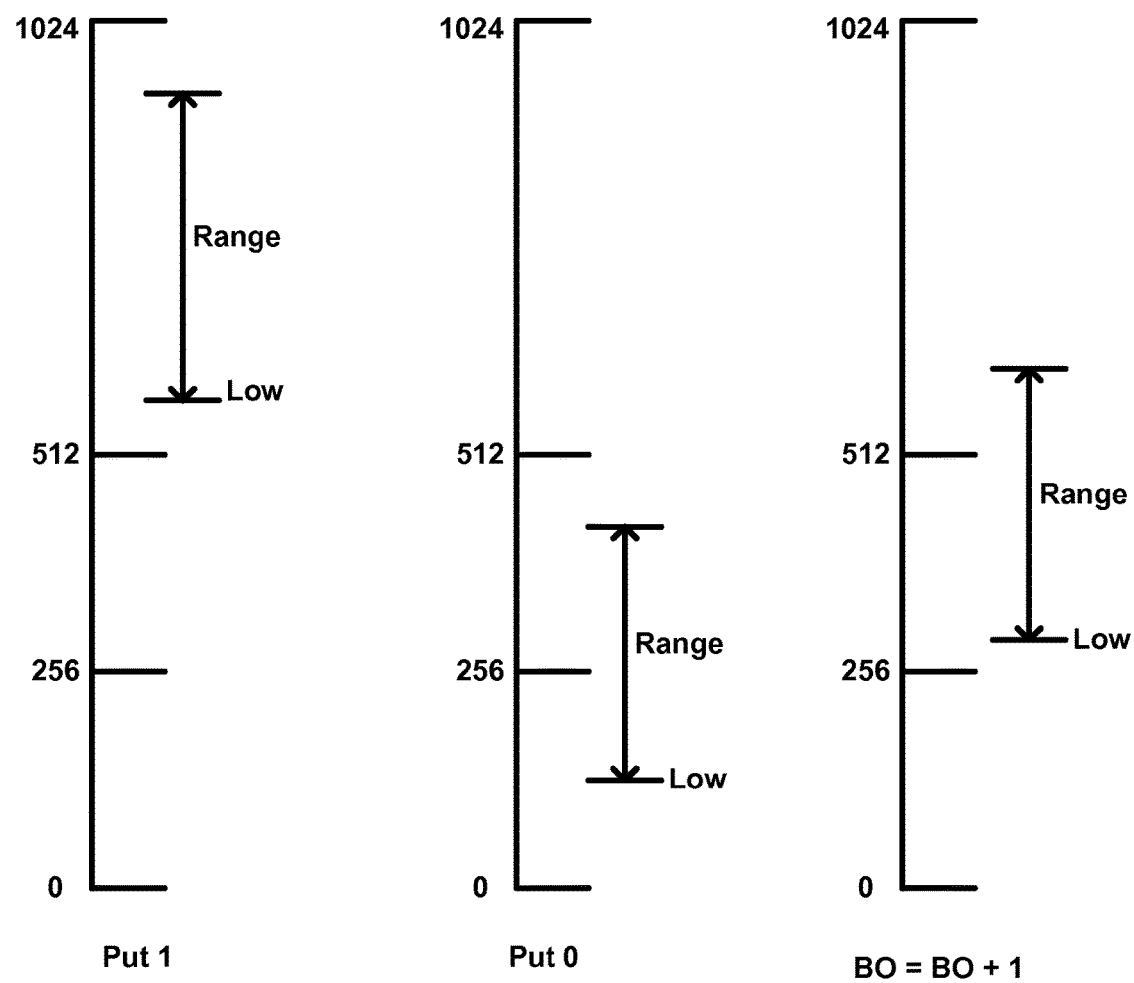
FIG. 3 is a conceptual diagram illustrating an output process in binary arithmetic coding.

In one proposal for the HEVC video coding process, range is expressed with 9 bits and the low with 10 bits. There is a renormalization process to maintain the range and low values at sufficient precision. The renormalization occurs whenever the range is less than 256. Therefore, the range is always equal or larger than 256 after renormalization. Depending on the values of range and low, the BAC outputs to the bitstream, a '0,' or a '1,' or updates an internal variable (called BO: bits-outstanding) to keep for future outputs. FIG. 3 shows examples of BAC output depending on the range. For example, a '1' is output to the bitstream when the range and low are above a certain threshold (e.g., 512). A '0' is output to the bitstream when the range and low are below a certain threshold (e.g., 512). Nothing is output to the bitstream when the range and lower are between certain thresholds. Instead, the BO value is incremented and the next bin is encoded.

In the CABAC context model of H.264/AVC and in some proposals for HEVC, there are 128 states. There are 64 possible LPS probabilities (denoted by state σ) that can be from 0 to 63. Each MPS can be zero or one. As such, the 128 states are 64 state probabilities times the 2 possible values for MPS (0 or 1). Therefore, the state can be indexed with 7 bits.

To reduce the computation of deriving LPS ranges (rangeLPS$_\sigma$), results for all cases are pre-calculated and stored as approximations in a look-up table in H.264/AVC and in some proposals for HEVC. Therefore, the LPS range can be obtained without any multiplication by using a simple table lookup. Avoiding multiplication can be important for some devices or applications, since this operation may cause significant latency in many hardware architectures.

A 4-column pre-calculated LPS range table is used instead of the multiplication. The range is divided into four segments. The segment index can be derived by the question (range>>6)&3. In effect, the segment index is derived by shifting and dropping bits from the actual range. The following Table 1 shows the possible ranges and their corresponding indexes.

TABLE 1

| | Range Index | | | |
|---|---|---|---|---|
| Range | 256-319 | 320-383 | 384-447 | 448-511 |
| (range>>6) & 3 | 0 | 1 | 2 | 3 |

The LPS range table has then 64 entries (one for each probability state) times 4 (one for each range index). Each entry is the Range LPS, that is, the value of multiplying the range times the LPS probability. An example of part of this table is shown in the following Table 2. Table 2 depicts probability states 9-12. In one proposal for HEVC, the probability states may range from 0-63.

TABLE 2

| | RangeLPS | | | |
|---|---|---|---|---|
| | RangeLPS | | | |
| Prob State (σ) | Index 0 | Index | Index 2 | Index 3 |
| ... | ... | ... | ... | ... |
| 9 | 90 | 110 | 130 | 150 |
| 10 | 85 | 104 | 123 | 142 |
| 11 | 81 | 99 | 117 | 135 |
| 12 | 77 | 94 | 111 | 128 |
| ... | ... | ... | ... | ... |

In each segment (i.e., range value), the LPS range of each probability state σ is pre-defined. In other words, the LPS range of a probability state σ is quantized into four values (i.e., one value for each range index). The specific LPS range used at a given point depends on which segment the range belongs to. The number of possible LPS ranges used in the table is a trade-off between the number of table columns (i.e., the number of possible LPS range values) and the LPS range precision. Generally speaking, more columns results in smaller quantization errors of LPS range values, but also increases the need for more memory to store the table. Fewer columns increases quantization errors, but also reduces the memory needed to store the table.

As described above, each LPS probability state has a corresponding probability. The probability for each state is derived as follows:

$p_\sigma = \alpha p_{\sigma-1}$ where the state σ is from 0 to 63. The constant α represents the amount of probability change between each context state. In one example, α=0.9493, or, more precisely, α=(0.01875/0.5)$^{1/63}$. The probability at state σ=0 is equal to 0.5 (i.e., p$_0$=½). That is, at context state 0, the LPS and MPS are equally probable. The probability at each successive state is derived by multiplying the previous state by α. As such, the probability of the LPS occurring at context state α=1 is p$_0$*0.9493(0.5*0.9493=0.47465). As such, as the index of state α increases, the probability of the LPS occurring goes down.

CABAC is adaptive because the probability states are updated in order to follow the signal statistics (i.e., the values of previously coded bins). The update process is as follows. For a given probability state, the update depends on the state index and the value of the encoded symbol identified either as an LPS or an MPS. As a result of the updating process, a new probability state is derived, which consists of a potentially modified LPS probability estimate and, if necessary, a modified MPS value.

In the event of a bin value equaling the MPS, a given state index is simply incremented by 1. This for all states except when an MPS occurs at state index 62, where the LPS probability is already at its minimum (or equivalently, the maximum MPS probability is reached). In this case, the state index 62 remains fixed until an LPS is seen, or the last bin value is encoded (state 63 is used for the special case of the last bin value). When an LPS occurs, the state index is changed by decrementing the state index by a certain amount, as shown in the equation below. This rule applies in general to each occurrence of a LPS with the following exception. Assuming a LPS has been encoded at the state with index σ=0, which corresponds to the equi-probable case, the state index remains fixed, but the MPS value will be toggled such that the value of the LPS and MPS will be interchanged. In all other cases, no matter which symbol has been encoded, the MPS value will not be altered. The derivation of the transition rules for the LPS probability is based on the following relation between a given LPS probability $p_{old}$ and its updated counterpart $p_{new}$:

$p_{new}=\max(\alpha p_{old}, p_{62})$ if a MPS occurs $p_{new}=(1-\alpha)+\alpha p_{old}$ if a LPS occurs With regard to a practical implementation of the probability estimation process in CABAC, it is important to note that all transition rules may be realized by at most two tables each having 63 entries of 6-bit unsigned integer values. In some examples, state transitions may be determined with a single table TransIdxLPS, which determines, for a given state index σ, the new updated state index TransIdxLPS [σ] in case an LPS has been observed. The MPS-driven transitions can be obtained by a simple (saturated) increment of the state index by the fixed value of 1, resulting in an updated state index min(σ+1, 62). Table 3 below is an example of a partial TransIdxLPS table.

TABLE 3

TransIdxLPS

| Prob State (σ) | New State TransIdxLPS [σ] |
|---|---|
| ... | ... |
| 9 | 6 |
| 10 | 8 |
| 11 | 8 |
| 12 | 8 |
| ... | ... |

One problem with previous BAC approaches (e.g., the BAC approach used in H.264/AVC), is that the tables RangeLPS and TransIdxLPS are tuned for low resolution videos, (i.e., common intermediate format (CIF) and quarter-CIF (QCIF) videos). Currently, a large amount of video content is high definition (HD) and, in some cases, greater than HD. Video content that is HD or greater than HD resolution has different statistics than the 10-year-old QCIF sequences used to develop H.264/AVC.

As such, tables RangeLPS and TransIdxLPS from H.264/AVC may cause adaptation between states in a manner that is too quick. That is, the transitions between probability states, especially when an LPS occurs, can be too great for the smoother, higher resolution content of HD video. Thus, the probability models used according to conventional techniques are not as accurate as they could be for HD and extra-HD content. In addition, as HD video content includes a greater range of pixel values, the H.264/AVC tables do not include enough entries to account for the more extreme values that may be present in HD content.

As such, there is a need for the RangeLPS and TransIdxLPS tables to be modified to account for the characteristics of this new content. This also implies that BAC should be different in at least two aspects. One difference is that BAC processes should use tables that allow for a slower adaptation process. Another difference is that BAC processes should account for more extreme cases (i.e., skewed probabilities).

The current RangeLPS and TransIdxLPS tables can be modified to achieve these goals by simply including more probability states and ranges. However, this solution incurs a substantial increase in the sizes of the tables. Slower adaptation may be achieved by using a parameter α closer to 1 than the currently used parameter α (e.g., α=0.9493). However, using a larger value of α causes the probabilities to tend to 0 more slowly, and as such, more states are needed. In addition, to achieve slower adaptation, it is beneficial if the lowest possible probability is much lower than the currently used lowest probability. As such, even more states may be needed to reach that very low probability value.

In view of the foregoing problems, this disclosure proposes techniques to modify BAC so as to attain slower adaptation and more skewed probabilities while keeping the table sizes (e.g., the RangeLPS and TransIdxLPS tables) at a practical level. In other words, this disclosure describes techniques to achieve slower adaptation and more extreme probabilities (i.e., probabilities closer to 0 and 1) while using relatively small-sized tables.

The techniques described in this disclosure may use more probability states, e.g., more probability states than used in BAC with H.264/AVC or as currently proposed for HEVC. In this case, the TransIdxLPS table can obtain slower adaptation and lower probabilities. In one example, the techniques described in this disclosure may use 128 probability states instead of 64. This increases the table TransIdxLPS by 64 entries (i.e., 128 entries instead of 64). This increase allows for slower adaptation and lower minimal probability. As one example, by setting the parameter α=0.9689, the differences between contiguous probabilities become smaller. Additionally, the lowest minimum probability goes down to 0.009, which is around one half of the H.264/AVC case (i.e., 0.01875). Other numbers of states and α values are also possible, though, in general, the number of states may be increased and the value of α may be closer to 1 than the H.264/AVC case of α=0.9493.

Another parameter that might be modified to improve HD or extra-HD coding is the parameter $p_0$. The value of $p_0$ generally indicates the maximum probability for the LPS. The reason to consider this possibility is that having a lower $p_0$ means that the minimal probability also decreases. The value of $p_0$ is set to 0.5 in the conventional BAC process. This disclosure proposes to allow for other values for $p_0$. Having other values of $p_0$ lower than 0.5 allows for smoother transitions at state 0 when the MPS/LPS swap occurs. In one example, it is proposed that $p_0$ be equal to 0.493, although many other examples could be also be used.

Usually, each probability state has its own entry in the RangeLPS table. The table size may be represented as:

probability states×# quantized range indexes which is 64×4=256 bytes in some proposals for HEVC. Since the number of states would increase in examples of this disclosure (doubled in the example above), the RangeLPS table size may be 128×4=512 bytes. To avoid this increase in the RangeLPS table size, however, this disclosure further proposes to map the probability states indexes to a lower size (i.e., a few number of indexes) to index the RangeLPS size. In other words, this disclosure proposes to decouple the state transition process from the range computation process. This means, in the current example, that there is a map for the states to range computation. In one particular example, this disclosure proposes a process by which video encoder 20 and/or video decoder 30 in configured to map an index indicating the determined probability state to one of a plurality of grouped indexes (e.g., grouped index for a RangeLPS table), wherein at least one of the grouped indexes represents at least two of the plurality of probability states. As such, the RangeLPS table (or other BAC tables) may use fewer indexes than there are probability states.

In one example of the disclosure, the probability state number may be divided by two to generate a new index to use as an entry for the RangeLPS table. In this case, the 128 probability states are reduced to 64 entries. Consequently, the RangeLPS table can keep the current size as used in H.264/AVC. Therefore, instead of using the probability state σ to index the entry in the range LPS table, the techniques described in this disclosure employs (σ>>1), that is, the state σ is divided by two and rounded to the lower integer for use as a grouped index into the RangeLPS table. The division can be by a larger number if the RangeLPS table is desired to be smaller for a given implementation, or if the number of states is larger (e.g., 256 probability states). In this context, each grouped index represents two probability states. In other examples of the disclosure, the grouped indexes may represent two or more probability states.

From an optimal entropy point of view, the grouping of the states for the RangeLPS table by using the division or right bit-shift operation may be beneficial, but may not always be the optimal technique. The optimal grouping may depend on several factors, including the number of states and the parameter α, among others. The most desirable (and possibly optimal) grouping might not be a straightforward operation like the bit-shift operation. In general, the grouping can be described with a table, going from the total number of probability states to a reduced number of probability state (i.e., grouped states). In another example, this disclosure proposes to use this kind of table. This approach would enhance performance (compared to the division or right shifting), at the cost of additional memory. As such, this example is a trade-off between memory and performance, favoring better performance over the linear mapping example (i.e., the division or right shifting).

Hence, although a linear mapping of probability states to entries in the RangeLPS table may be used, it may be desirable to provide a nonlinear mapping. For example, the probability states may be mapped according to a logarithmic mapping. A logarithmic mapping may be achieved, in some examples, using piecewise linear mapping techniques. In general, such a mapping may be defined using a table, such as a precomputed mapping table.

In general, the techniques described in this disclosure may be performed, in some examples, by a method or device for entropy coding video data. The method may include determining a probability state of symbols in a binary arithmetic coding process, wherein the probability state comprises one of a plurality of probability states, and mapping an index indicating the determined probability state to one of a plurality of grouped indexes, wherein at least one of the grouped indexes represents at least two of the plurality of probability states, and wherein each of the grouped indexes points to a range for a lowest probability symbol in a table.

The number of probability states may be greater than 64. For example, the number of probability states may be 128. In some examples, the number of grouped indexes used as an input into the RangeLPS table is 64. In particular, the number of probability states may be 128 and the number of grouped indexes used as an input into the RangeLPS table may be 64. A symbol may be coded based on the grouped indexes, e.g., according to a table based on the probability state index, or according to a mathematical operation based on the index. The determined probability state maps to one of a plurality of indexes according to a table, or according to a mathematical operation. The mapping may be linear or nonlinear. For example, the mapping may be performed according to a divide-by-two operation. In some examples, the mapping may be a logarithmic mapping. In some examples, a piecewise linear mapping may be used to define a logarithmic mapping. In some examples, the value $p_0$ of the maximum probability for the LPS may be less than 0.5.

The techniques described in this disclosure may be performed, for example, within a video encoder, video decoder, or combined video encoder-decoder (CODEC). In particular, such techniques may be performed in an entropy encoding unit of a video encoder and/or an entropy decoding unit of a video decoder. The techniques may be performed, for example, within a CABAC process, which may be configured to support video coding, such as video coding according to aspects of the HEVC standard currently under development. Entropy encoding and decoding units may be apply coding processes in a reciprocal or inverse manner, e.g., to encode or decode any of a variety of video data, such as quantized transform coefficients associated with residual video data, motion vector information, syntax elements, and other types of information that may be useful in a video encoding and/or video decoding process.

Figure 4:
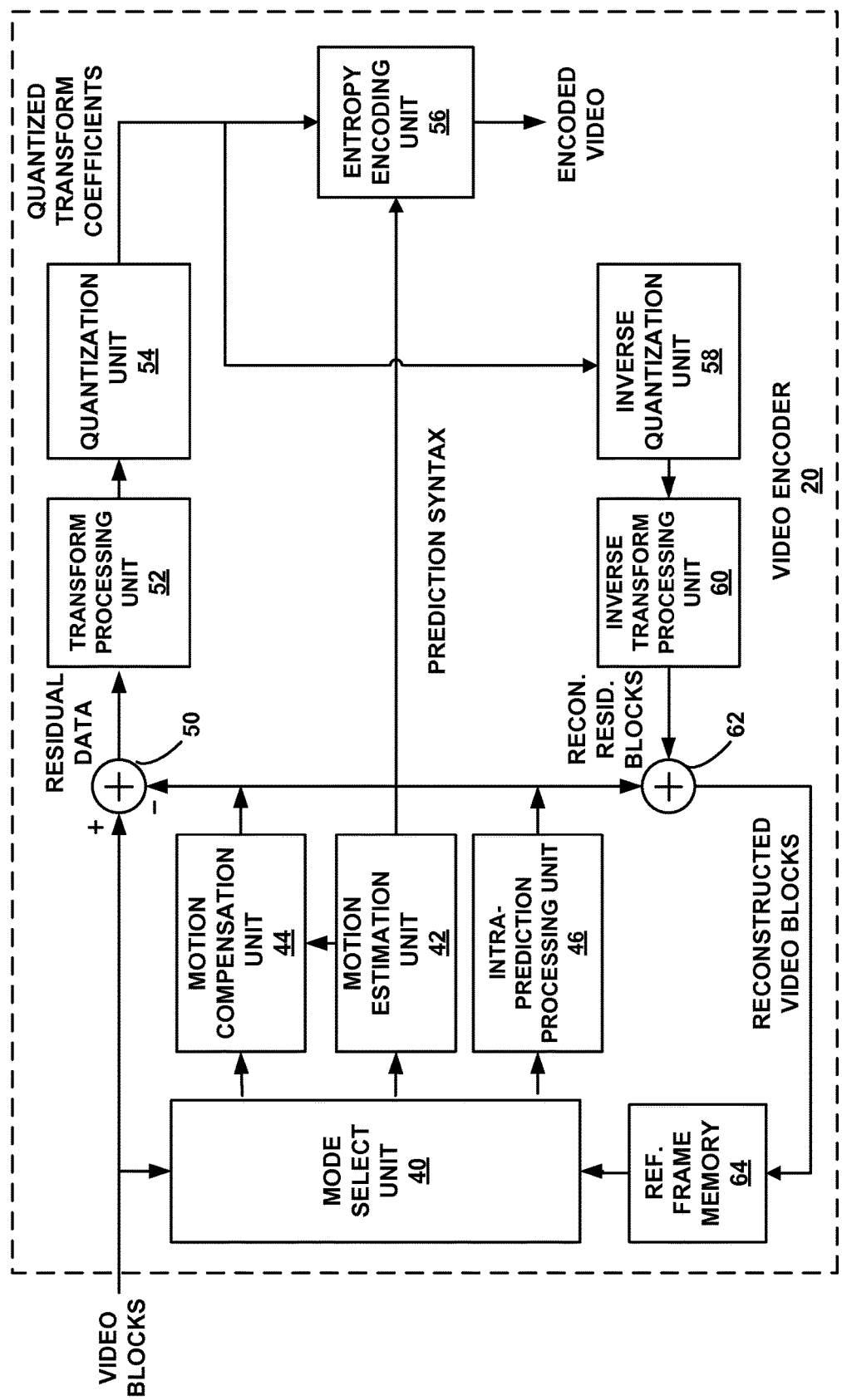
FIG. 4 is a block diagram illustrating an example video encoder.

FIG. 4 is a block diagram illustrating an example of a video encoder 20 that may be configured to utilize techniques for BAC coding, as described in this disclosure. The video encoder 20 will be described in the context of HEVC coding for purposes of illustration, but without limitation of this disclosure as to other coding standards or methods. The video encoder 20 may perform intra- and inter-coding of CUs within video frames. Intra-coding relies on spatial prediction to reduce or remove spatial redundancy in video data within a given video frame. Inter-coding relies on temporal prediction to reduce or remove temporal redundancy between a current frame and previously coded frames of a video sequence. Intra-mode (I-mode) may refer to any of several spatial-based video compression modes. Inter-modes such as uni-directional prediction (P-mode) or bi-directional prediction (B-mode) may refer to any of several temporal-based video compression modes.

As shown in FIG. 4, the video encoder 20 receives a current video block within a video frame to be encoded. In the example of FIG. 4, the video encoder 20 includes a motion compensation unit 44, a motion estimation unit 42, an intra-prediction processing unit 46, a reference frame memory 64, a summer 50, a transform processing unit 52, a quantization unit 54, and an entropy encoding unit 56. The transform processing unit 52 illustrated in FIG. 4 is the unit that applies the actual transform or combinations of transform to a block of residual data, and is not to be confused with block of transform coefficients, which also may be referred to as a transform unit (TU) of a CU. For video reconstruction, the video encoder 20 also includes an inverse quantization unit 58, an inverse transform processing unit 60, and a summer 62. A deblocking filter (not shown in FIG. 4) may also be included to filter block boundaries to remove blockiness artifacts from reconstructed video. If desired, the deblocking filter would typically filter the output of the summer 62.

During the encoding process, the video encoder 20 receives a video frame or slice to be coded. The frame or slice may be divided into multiple video blocks, e.g., largest coding units (LCUs). The motion estimation unit 42 and the motion compensation unit 44 perform inter-predictive coding of the received video block relative to one or more blocks in one or more reference frames to provide temporal compression. The intra-prediction processing unit 46 may perform intra-predictive coding of the received video block relative to one or more neighboring blocks in the same frame or slice as the block to be coded to provide spatial compression.

The mode select unit 40 may select one of the coding modes, intra or inter, e.g., based on error (i.e., distortion) results for each mode, and provides the resulting intra- or inter-predicted block (e.g., a prediction unit (PU)) to the summer 50 to generate residual block data and to the summer 62 to reconstruct the encoded block for use in a reference frame. Summer 62 combines the predicted block with inverse quantized, inverse transformed data from inverse transform processing unit 60 for the block to reconstruct the encoded block, as described in greater detail below. Some video frames may be designated as I-frames, where all blocks in an I-frame are encoded in an intra-prediction mode. In some cases, the intra-prediction processing unit 46 may perform intra-prediction encoding of a block in a P- or B-frame, e.g., when motion search performed by the motion estimation unit 42 does not result in a sufficient prediction of the block.

The motion estimation unit 42 and the motion compensation unit 44 may be highly integrated, but are illustrated separately for conceptual purposes. Motion estimation (or motion search) is the process of generating motion vectors, which estimate motion for video blocks. A motion vector, for example, may indicate the displacement of a prediction unit in a current frame relative to a reference sample of a reference frame. The motion estimation unit 42 calculates a motion vector for a prediction unit of an inter-coded frame by comparing the prediction unit to reference samples of a reference frame stored in the reference frame memory 64. A reference sample may be a block that is found to closely match the portion of the CU including the PU being coded in terms of pixel difference, which may be determined by sum of absolute difference (SAD), sum of squared difference (SSD), or other difference metrics. The reference sample may occur anywhere within a reference frame or reference slice, and not necessarily at a block (e.g., coding unit) boundary of the reference frame or slice. In some examples, the reference sample may occur at a fractional pixel position.

The motion estimation unit 42 sends the calculated motion vector and other syntax elements to the entropy encoding unit 56 and the motion compensation unit 44. The portion of the reference frame identified by a motion vector may be referred to as a reference sample. The motion compensation unit 44 may calculate a prediction value for a prediction unit of a current CU, e.g., by retrieving the reference sample identified by a motion vector for the PU.

The intra-prediction processing unit 46 may perform intra-prediction on the received block, as an alternative to inter-prediction performed by the motion estimation unit 42 and the motion compensation unit 44. The intra-prediction processing unit 46 may predict the received block relative to neighboring, previously coded blocks, e.g., blocks above, above and to the right, above and to the left, or to the left of the current block, assuming a left-to-right, top-to-bottom encoding order for blocks. The intra-prediction processing unit 46 may be configured with a variety of different intra-prediction modes. For example, the intra-prediction processing unit 46 may be configured with a certain number of directional prediction modes, e.g., thirty-five directional prediction modes, based on the size of the CU being encoded.

The intra-prediction processing unit 46 may select an intra-prediction mode by, for example, calculating error values for various intra-prediction modes and selecting a mode that yields the lowest error value. Directional prediction modes may include functions for combining values of spatially neighboring pixels and applying the combined values to one or more pixel positions in a PU. Once values for all pixel positions in the PU have been calculated, the intra-prediction processing unit 46 may calculate an error value for the prediction mode based on pixel differences between the PU and the received block to be encoded. The intra-prediction processing unit 46 may continue testing intra-prediction modes until an intra-prediction mode that yields an acceptable error value is discovered. The intra-prediction processing unit 46 may then send the PU to the summer 50.

The video encoder 20 forms a residual block by subtracting the prediction data calculated by the motion compensation unit 44 or the intra-prediction processing unit 46 from the original video block being coded. The summer 50 represents the component or components that perform this subtraction operation. The residual block may correspond to a two-dimensional matrix of pixel difference values, where the number of values in the residual block is the same as the number of pixels in the PU corresponding to the residual block. The values in the residual block may correspond to the differences, i.e., error, between values of co-located pixels in the PU and in the original block to be coded. The differences may be chroma or luma differences depending on the type of block that is coded.

The transform processing unit 52 may form one or more transform units (TUs) from the residual block. The transform processing unit 52 selects a transform from among a plurality of transforms. The transform may be selected based on one or more coding characteristics, such as block size, coding mode, or the like. The transform processing unit 52 then applies the selected transform to the TU, producing a video block comprising a two-dimensional array of transform coefficients. In addition, the transform processing unit 52 may signal the selected transform partition in the encoded video bitstream.

The transform processing unit 52 may send the resulting transform coefficients to the quantization unit 54. The quantization unit 54 may then quantize the transform coefficients. The quantization matrix may specify values that, with a quantization parameter, may be used to determine an amount of quantization to be applied to corresponding transform coefficients. The entropy encoding unit 56 may perform a scan of the quantized transform coefficients in the matrix according to a scanning mode. This disclosure describes the entropy encoding unit 56 as performing the scan. However, it should be understood that, in other examples, other processing units, such as the quantization unit 54, could perform the scan.

Once the transform coefficients are scanned into the one-dimensional array, the entropy encoding unit 56 may apply entropy coding such as context-adaptive variable length coding (CAVLC), context-adaptive binary arithmetic coding (CABAC), probability interval partitioning entropy coding (PIPE), Golomb coding, Golomb-Rice coding, exponential Golomb coding, syntax-based context-adaptive binary arithmetic coding (SBAC), or another entropy coding methodology to the coefficients. Although reference is made to a variety of different entropy coding processes, in accordance with examples of this disclosure, entropy encoding unit 56 may be configured to perform BAC coding as described above.

To perform CAVLC, the entropy encoding unit 56 may select a variable length code for a symbol to be transmitted. Codewords in VLC may be constructed such that relatively shorter codes correspond to more likely symbols, while longer codes correspond to less likely symbols. In this way, the use of VLC may achieve a bit savings over, for example, using equal-length codewords for each symbol to be transmitted.

To perform CABAC, the entropy encoding unit 56 may select a context model to apply to a certain context to encode symbols to be transmitted. The context may relate to, for example, whether neighboring values are non-zero or not. The entropy encoding unit 56 may also entropy encode syntax elements, such as the signal representative of the selected transform. Following the entropy coding by the entropy encoding unit 56, the resulting encoded video may be transmitted to another device, such as the video decoder 30, or archived for later transmission or retrieval.

Figure 5:
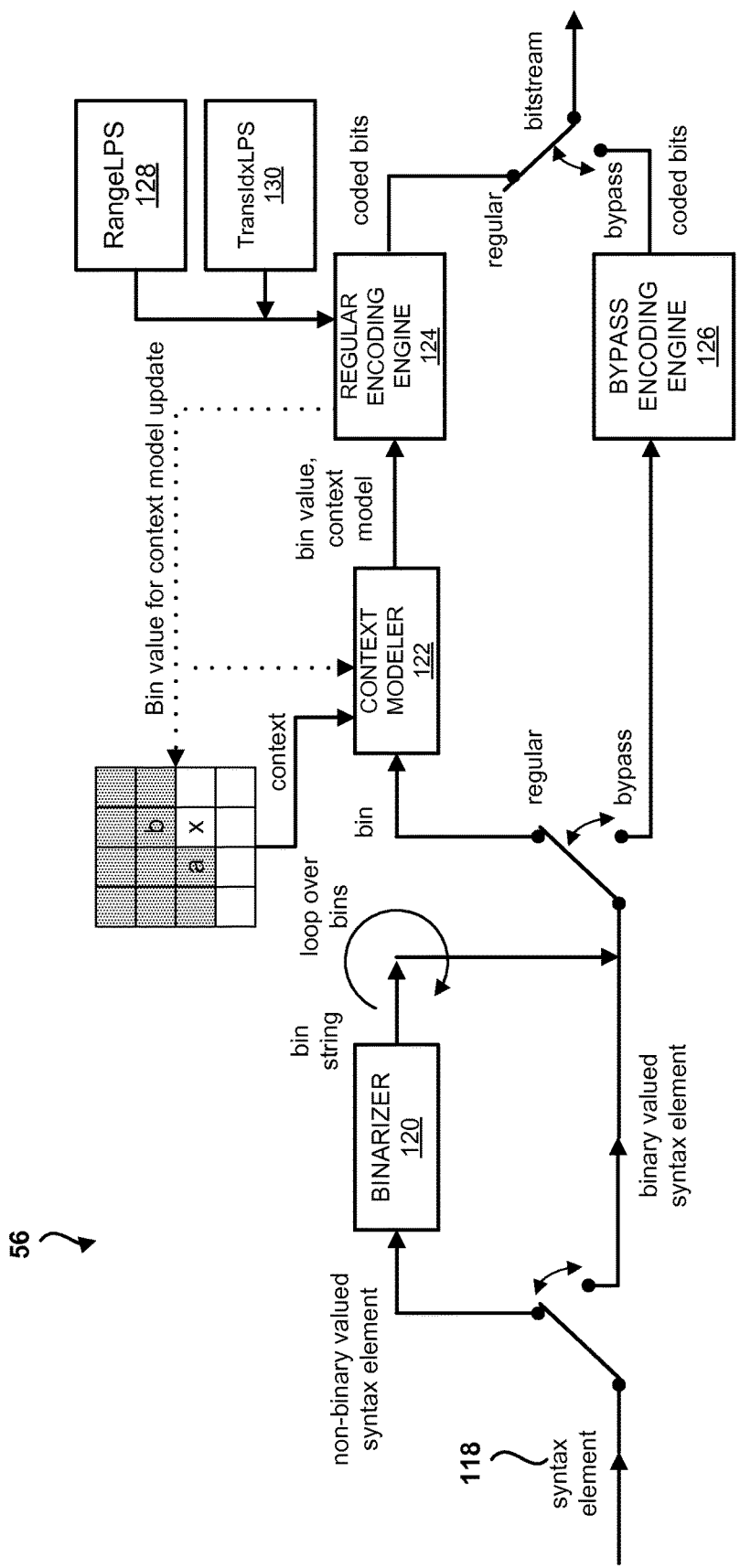
FIG. 5 is a block diagram illustrating a context adaptive binary arithmetic coder in a video encoder.

FIG. 5 is a block diagram of an example entropy encoding unit 56 that may be configured to perform CABAC in accordance with the techniques of this disclosure. A syntax element 118 is input into the entropy encoding unit 56. If the syntax element is already a binary-value syntax element (i.e., a syntax element that only has a value of 0 and 1), the step of binarization may be skipped. If the syntax element is a non-binary valued syntax element (e.g., a syntax element represented by multiple bits, such as transform coefficient levels), the non-binary valued syntax element is binarized by binarizer 120. Binarizer 120 performs a mapping of the non-binary valued syntax element into a sequence of binary decisions. These binary decisions are often called "bins." For example, for transform coefficient levels, the value of the level may be broken down into successive bins, each bin indicating whether or not the absolute value of coefficient level is greater than some value. For example, bin 0 (sometimes called a significance flag) indicates if the absolute value of the transform coefficient level is greater than 0 or not. Bin 1 indicates if the absolute value of the transform coefficient level is greater than 1 or not, and so on. A unique mapping may be developed for each non-binary valued syntax element.

Each bin produced by binarizer 120 is fed to the binary arithmetic coding side of entropy coding unit 56. That is, for a predetermined set of non-binary valued syntax elements, each bin type (e.g., bin 0) is coded before the next bin type (e.g., bin 1). Coding may be performed in either regular mode or bypass mode. In bypass mode, bypass coding engine 126 performs arithmetic coding using a fixed probability model, for example, using Golomb-Rice or exponential Golomb coding. Bypass mode is generally used for more predictable syntax elements.

Coding in regular mode involves performing CABAC. Regular mode CABAC is for coding bin values where the probability of a value of a bin is predictable given then values of previously coded bins. The probability of a bin being an LPS is determined by context modeler 122. Context modeler 122 outputs the bin value and the context model (e.g., the probability state σ). The context model may be an initial context model for a series of bins, or may be determined based on the coded values of previously coded bins. As described above, the context modeler may update the state based on whether or not the previously-coded bin was an MPS or an LPS.

After the context model and probability state σ is determined by context modeler 122, regular coding engine 124 performs BAC on the bin value. According to the techniques of this disclosure, regular coding engine 124 performs BAC using TransIdxLPS table 130 that includes more than 64 probability states σ. In one example, the number of probability states is 128. TransIdxLPS is used to determine which probability state is used for a next bin (bin n+1) when the previous bin (bin n) is an LPS. Regular coding engine 124 may also use a RangeLPS table 128 to determine the range value for an LPS given a particular probability state σ. However, according to the techniques of this disclosure, rather than using all possible probability states σ of the TransIdxLPS table 130, the probability state indexes σ are mapped to grouped indexes for use in the RangeLPS table. That is, each index into the RangeLPS table 128 may represent two or more of the total number of probability states. The mapping of probability state index σ to grouped indexes may be linear (e.g., by dividing by two), or may be non-linear (e.g., a logarithmic function or mapping table).

In other examples of the disclosure, the difference between successive probability states may be made smaller by setting the parameter α to be greater than 0.9493. In one example α=0.9689. In another example of the disclosure, the highest probability ($p_0$) of an LPS occurring may be set to be lower than 0.5. In one example, it is proposed that $p_0$ be equal to 0.493.

Returning to FIG. 4, in some cases, the entropy encoding unit 56 or another unit of the video encoder 20 may be configured to perform other coding functions, in addition to entropy coding. For example, the entropy encoding unit 56 may be configured to determine coded block pattern (CBP) values for CU's and PU's. Also, in some cases, the entropy encoding unit 56 may perform run length coding of coefficients. In addition, entropy encoding unit 56, or other processing units, also may code other data, such as the values of a quantization matrix.

The inverse quantization unit 58 and the inverse transform processing unit 60 apply inverse quantization and inverse transformation, respectively, to reconstruct the residual block in the pixel domain, e.g., for later use as a reference block. The motion compensation unit 44 may calculate a reference block by adding the residual block to a predictive block of one of the frames of the reference frame memory 64. The motion compensation unit 44 may also apply one or more interpolation filters to the reconstructed residual block to calculate sub-integer pixel values for use in motion estimation. The summer 62 adds the reconstructed residual block to the motion compensated prediction block produced by the motion compensation unit 44 to produce a reconstructed video block for storage in the reference frame memory 64. The reconstructed video block may be used by the motion estimation unit 42 and the motion compensation unit 44 as a reference block to inter-code a block in a subsequent video frame.

Figure 6:
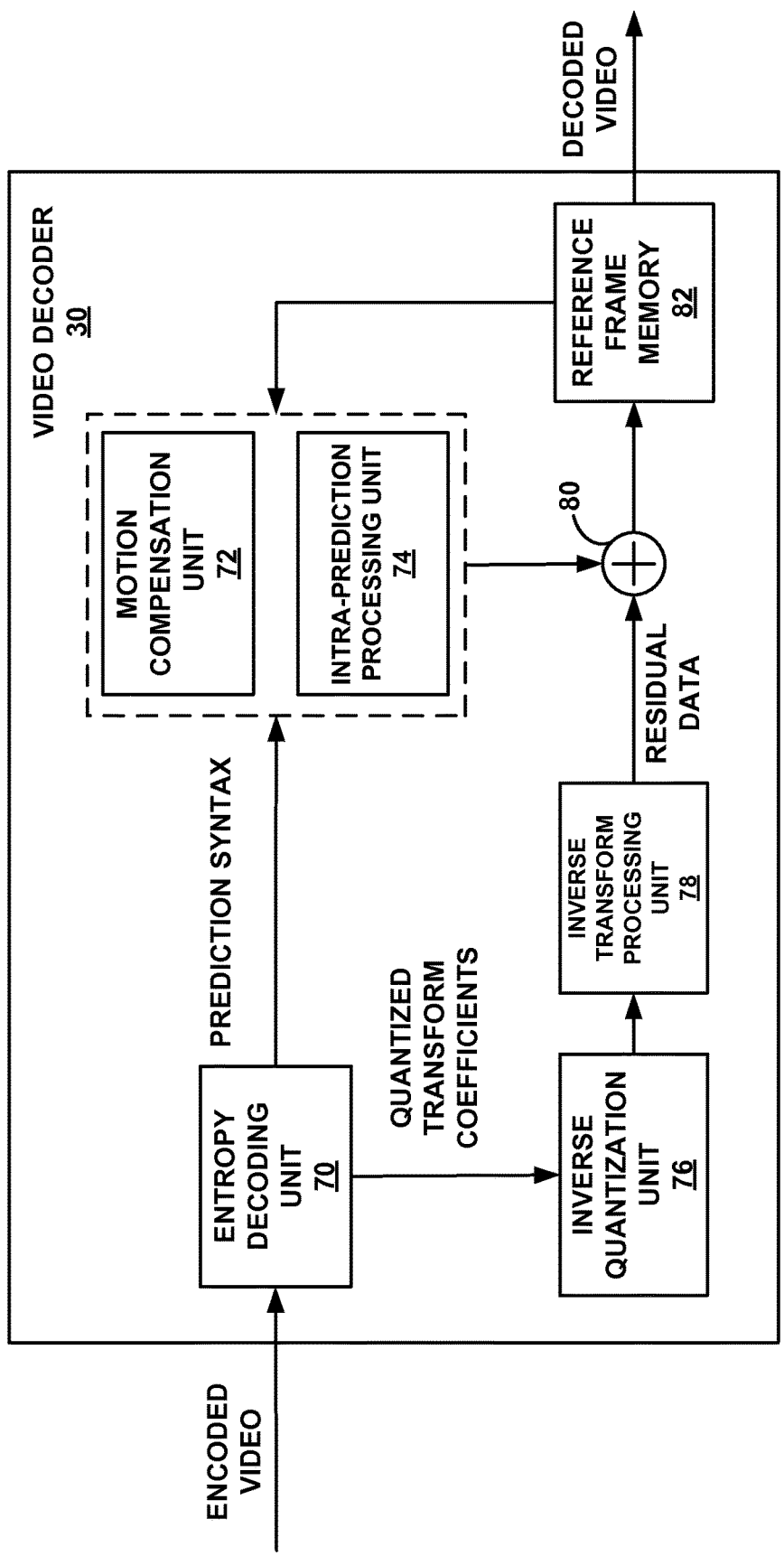
FIG. 6 is a block diagram illustrating an example video decoder.

FIG. 6 is a block diagram illustrating an example of a video decoder 30, which decodes an encoded video sequence. In the example of FIG. 6, the video decoder 30 includes an entropy decoding unit 70, a motion compensation unit 72, an intra-prediction processing unit 74, an inverse quantization unit 76, an inverse transformation unit 78, a reference frame memory 82 and a summer 80. The video decoder 30 may, in some examples, perform a decoding pass generally reciprocal to the encoding pass described with respect to the video encoder 20 (see FIG. 4). Entropy decoding unit 70 or another coding unit may be configured to use an inverse of the modified mapping described above, e.g., for quantization matrix values or other values, such as video data, using a modified mapping of source symbols. In particular, entropy decoding unit 70 may apply a process that is generally inverse to the process used by the encoder. The entropy decoding unit 70 performs an entropy decoding process on the encoded bitstream to retrieve a one-dimensional array of transform coefficients. The entropy decoding process used depends on the entropy coding used by the video encoder 20 (e.g., CABAC, CAVLC, PIPE, or other processes described above). In accordance with the techniques described in this disclosure, entropy decoding unit 70 may apply a BAC process, e.g., within a CABAC process, as described in this disclosure. The entropy coding process used by the encoder may be signaled in the encoded bitstream or may be a predetermined process.

Figure 7:
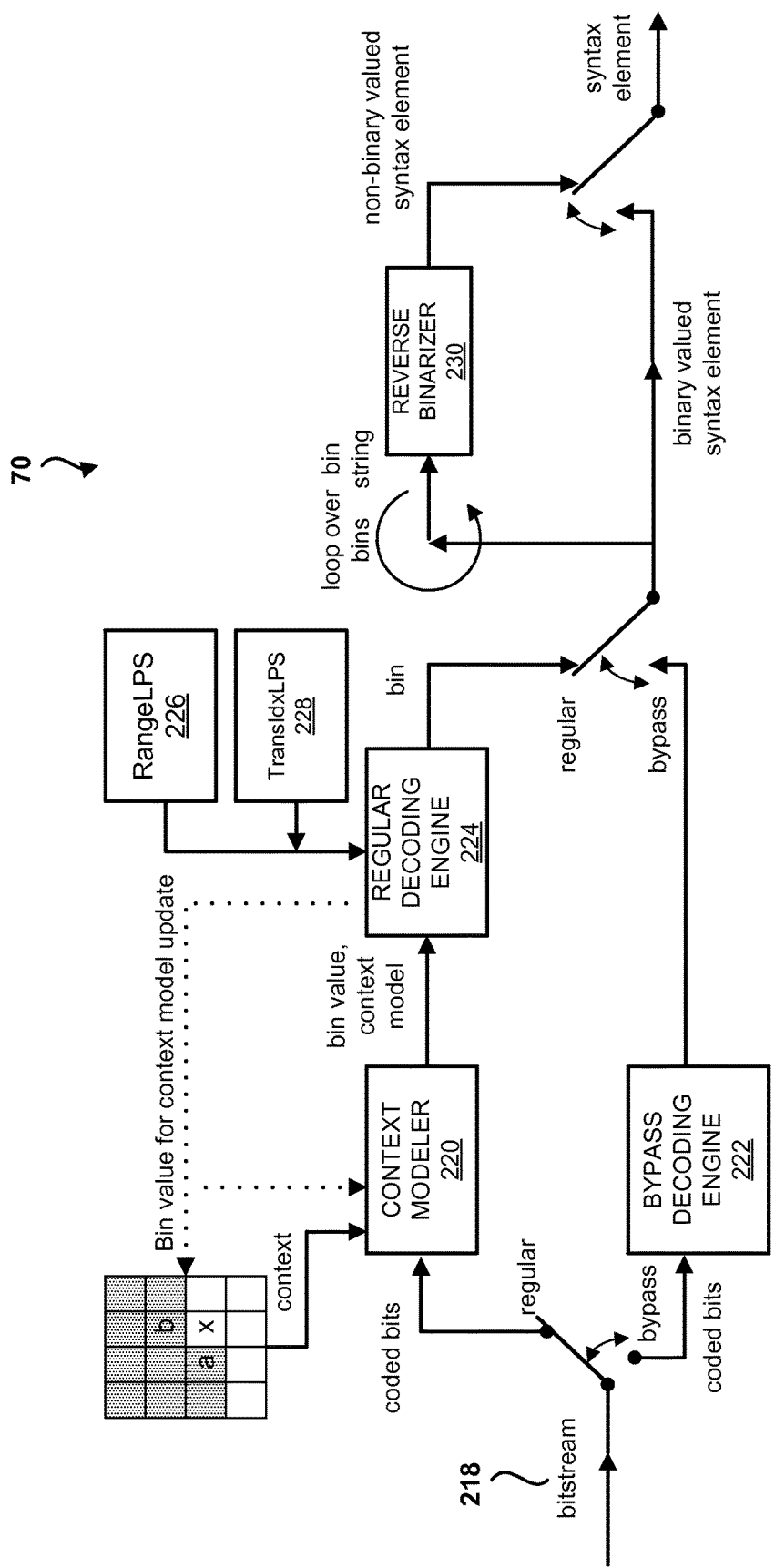
FIG. 7 is a block diagram illustrating a context adaptive binary arithmetic coder in a video decoder.

FIG. 7 is a block diagram of an example entropy encoding unit 70 that may be configured to perform CABAC in accordance with the techniques of this disclosure. The entropy decoding unit 70 of FIG. 7 performs CABAC in an inverse manner as that of entropy encoding unit 56 described in FIG. 5. Coded bits from bitstream 218 are input into entropy decoding unit 70. The coded bits are fed to either context modeler 220 or bypass coding engine 222 based on whether or not they were entropy coded using bypass mode or regular mode. If the coded bits were coded in bypass mode, bypass decoding engine will use Golomb-Rice or exponential Golomb decoding, for example, to retrieve the binary-valued syntax elements or bins of non-binary syntax elements.

If the coded bits were coded in regular mode, context modeler 220 may determine a probability model for the coded bits and regular decoding engine 224 may decode the coded bits to produce bins of non-binary valued syntax elements (or the syntax elements themselves if binary-valued). After the context model and probability state $\sigma$ is determined by context modeler 220, regular decoding engine 224 performs BAC on the bin value. According to the techniques of this disclosure, regular decoding engine 224 performs BAC using TransIdxLPS table 228 that includes more than 64 probability states $\sigma$. In one example, the number of probability states is 128, although other numbers of probability states could be defined, consistent with the techniques of this disclosure. TransIdxLPS is used to determine which probability state is used for a next bin (bin n+1) when the previous bin (bin n) is an LPS. Regular decoding engine 224 may also use a RangeLPS table 226 to determine the range value for an LPS given a particular probability state $\sigma$. However, according to the techniques of this disclosure, rather than using all possible probability states $\sigma$ of the TransIdxLPS table 228, the probability state indexes $\sigma$ are mapped to grouped indexes for use in RangeLPS table 226. That is, each index into RangeLPS table 226 may represent two or more of the total number of probability states. The mapping of probability state index $\sigma$ to grouped indexes may be linear (e.g., by dividing by two), or may be non-linear (e.g., a logarithmic function or mapping table).

In other examples of the disclosure, the difference between successive probability states may be made smaller by setting the parameter $\alpha$ to be greater than 0.9493. In one example $\alpha$=0.9689. In another example of the disclosure, the highest probability ($p_0$) of an LPS occurring may be set to be lower than 0.5. In one example, it is proposed that $p_0$ be equal to 0.493.

After the bins are decoded by regular decoding engine 224, a reverse binarizer 230 may perform a reverse mapping to convert the bins back into the values of the non-binary valued syntax elements.

Returning to FIG. 6, in some examples, the entropy decoding unit 70 (or the inverse quantization unit 76) may scan the received values using a scan mirroring the scanning mode used by the entropy encoding unit 56 (or the quantization unit 54) of the video encoder 20. Although the scanning of coefficients may be performed in the inverse quantization unit 76, scanning will be described for purposes of illustration as being performed by the entropy decoding unit 70. In addition, although shown as separate functional units for ease of illustration, the structure and functionality of the entropy decoding unit 70, the inverse quantization unit 76, and other units of the video decoder 30 may be highly integrated with one another.

The inverse quantization unit 76 inverse quantizes, i.e., de-quantizes, the quantized transform coefficients provided in the bitstream and decoded by the entropy decoding unit 70. The inverse quantization process may include a conventional process, e.g., similar to the processes proposed for HEVC or defined by the H.264 decoding standard. The inverse quantization process may include use of a quantization parameter QP calculated by the video encoder 20 for the CU to determine a degree of quantization and, likewise, a degree of inverse quantization that should be applied. The inverse quantization unit 76 may inverse quantize the transform coefficients either before or after the coefficients are converted from a one-dimensional array to a two-dimensional array.

The inverse transform processing unit 78 applies an inverse transform to the inverse quantized transform coefficients. In some examples, the inverse transform processing unit 78 may determine an inverse transform based on signaling from the video encoder 20, or by inferring the transform from one or more coding characteristics such as block size, coding mode, or the like. In some examples, the inverse transform processing unit 78 may determine a transform to apply to the current block based on a signaled transform at the root node of a quadtree for an LCU including the current block. Alternatively, the transform may be signaled at the root of a TU quadtree for a leaf-node CU in the LCU quadtree. In some examples, the inverse transform processing unit 78 may apply a cascaded inverse transform, in which inverse transform processing unit 78 applies two or more inverse transforms to the transform coefficients of the current block being decoded.

In addition, the inverse transform processing unit may apply the inverse transform to produce a transform unit partition in accordance with the above-described techniques of this disclosure.

The intra-prediction processing unit 74 may generate prediction data for a current block of a current frame based on a signaled intra-prediction mode and data from previously decoded blocks of the current frame. Based on the retrieved motion prediction direction, reference frame index, and calculated current motion vector (e.g., a motion vector copied from a neighboring block according to a merge mode), the motion compensation unit produces a motion compensated block for the current portion. These motion compensated blocks essentially recreate the predictive block used to produce the residual data.

The motion compensation unit 72 may produce the motion compensated blocks, possibly performing interpolation based on interpolation filters. Identifiers for interpolation filters to be used for motion estimation with sub-pixel precision may be included in the syntax elements. The motion compensation unit 72 may use interpolation filters as used by the video encoder 20 during encoding of the video block to calculate interpolated values for sub-integer pixels of a reference block. The motion compensation unit 72 may determine the interpolation filters used by the video encoder 20 according to received syntax information and use the interpolation filters to produce predictive blocks.

Additionally, the motion compensation unit 72 and the intra-prediction processing unit 74, in an HEVC example, may use some of the syntax information (e.g., provided by a quadtree) to determine sizes of LCUs used to encode frame(s) of the encoded video sequence. The motion compensation unit 72 and the intra-prediction processing unit 74 may also use syntax information to determine split information that describes how each CU of a frame of the encoded video sequence is split (and likewise, how sub-CUs are split). The syntax information may also include modes indicating how each split is encoded (e.g., intra- or inter-prediction, and for intra-prediction an intra-prediction encoding mode), one or more reference frames (and/or reference lists containing identifiers for the reference frames) for each inter-encoded PU, and other information to decode the encoded video sequence.

The summer 80 combines the residual blocks with the corresponding prediction blocks generated by the motion compensation unit 72 or the intra-prediction processing unit 74 to form decoded blocks. If desired, a deblocking filter may also be applied to filter the decoded blocks in order to remove blockiness artifacts. The decoded video blocks are then stored in the reference frame memory 82, which provides reference blocks for subsequent motion compensation and also produces decoded video for presentation on a display device (such as the display device 32 of FIG. 1).

Figure 8:
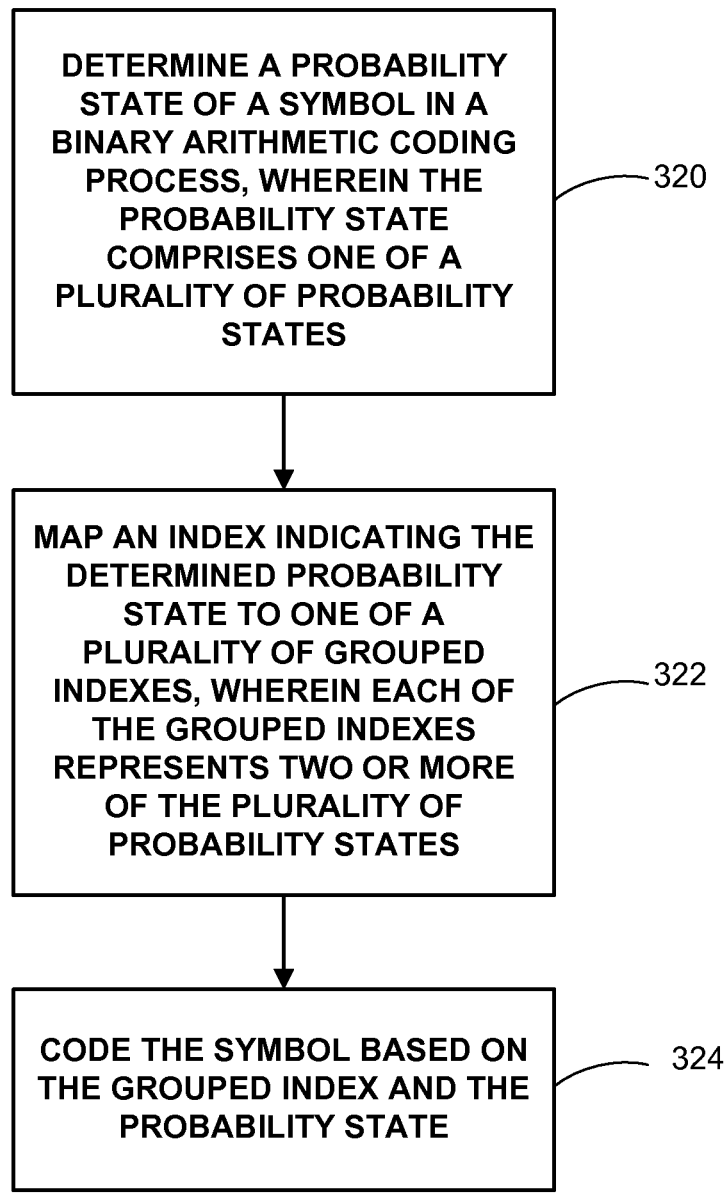
FIG. 8 is a flowchart illustrating an example method according to the techniques of this disclosure.

FIG. 8 is a flowchart depicting an example coding method according to the techniques of this disclosure. The techniques of the FIG. 8 may be executed by one or more components of a video encoder (e.g., video encoder 20 or video decoder 30). As one example, the method of FIG. 8 may be executed by entropy encoding unit 56 of video encoder 20 and/or by entropy decoding unit 70 of video decoder 30.

Video encoder 20 and/or video decoder 30 may be configured to perform a method of entropy coding of video data using a binary arithmetic coding process in a video coding process. Video encoder 20 and/or video decoder 30 may be configured to determine a probability state of a symbol in a binary arithmetic coding process, wherein the probability state comprises one of a plurality of probability states (320). Video encoder 20 and/or video decoder 30 may be further configured to map an index indicating the determined probability state to one of a plurality of grouped indexes, wherein at least one of the grouped indexes represents at least two of the plurality of probability states (322). Each of the grouped indexes identifies a range for a probability symbol in a table.

Mapping a probability state index to one of a plurality of grouped indexes may be accomplished in one of many ways. In one example, mapping comprises mapping the index to a grouped index according to a table. In another example, mapping comprises mapping the index to the grouped index according to a mathematical operation. In still another example, mapping comprises mapping the index to the grouped index according to a divide-by-two operation. In another example, mapping comprises mapping the index to the grouped index according to a linear mapping. In yet another example, mapping comprises mapping the index to the grouped index according to a logarithmic mapping. In still another example, mapping comprises mapping the index to the grouped index according to a piecewise non-linear mapping.

In one example of the disclosure, the number of the plurality of probability states is greater than 64. In a more specific example, the number of the plurality of probability states is 128. In another example of the disclosure, the number of grouped indexes is 64.

In another example of the disclosure, the plurality of probability states includes a highest probability state $p_0$, wherein successive probability states are determined by multiplying a previous probability state with a parameter $\alpha$. In one example, $\alpha$ is greater than 0.9493, and $p_0$ is less than 0.5. In a more specific example, $\alpha$ is approximately 0.9689 and $p_0$ is approximately 0.493.

Video encoder 20 and/or video decoder 30 may be further configured to code the symbol based on the grouped index and the probability state (324). In one example, coding the symbol may include coding the symbol according to a table based on the grouped index. In another example, coding the symbol may include coding the symbol according to a mathematical operation performed on the index to generate the grouped index.

The techniques of FIG. 8 may be implemented in a video encoding process by video encoder 20 to encode symbols. In one example, the symbols are levels of transform coefficients. In this example, the video encoding method may further include encoding video data to produce residual data, transforming residual data to produce transform coefficients, and binarizing transform coefficients to create the symbols.

The techniques of FIG. 8 may also be implemented in a video decoding process by video decoder 30 to decode symbols. In one example, the symbols are levels of transform coefficients. In one example, the symbols are levels of transform coefficients. In this example, coding the symbol based on the grouped index and the probability state produces decoded bins. The video decoding method may further include receiving the symbols, reverse binarizing the decoded bins to produce transform coefficients, inverse transforming the transform coefficients to produce residual data, and decoding the residual data to produce decoded video data.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of entropy coding of video data using a binary arithmetic coding process in a video coding process, the method comprising:
    determining a probability state of a symbol related to high definition (HD) video content in a binary arithmetic coding process, wherein the probability state is determined from a plurality of probability states for the HD video content, wherein a number of the plurality of probability states is greater than sixty-four (64), and wherein sixty-four (64) probability states represents a number of probability states used for video content having a resolution lower than the resolution associated with the HD video content; and
    mapping an index indicating the determined probability state to one of sixty-four (64) grouped indexes,
    wherein at least one grouped index of the sixty-four (64) grouped indexes represents at least two of the plurality of probability states, and wherein each of the sixty-four (64) grouped indexes identifies a range for a probability symbol in a table.

2. The method of claim 1, wherein the number of the plurality of probability states is 128.

3. The method of claim 1, further comprising coding the symbol based on the grouped index and the probability state.

4. The method of claim 3, wherein coding the symbol comprises coding the symbol according to a table based on the grouped index.

5. The method of claim 3, wherein coding the symbol comprises coding the symbol according to a mathematical operation performed on the index to generate the grouped index.

6. The method of claim 1, wherein mapping comprises mapping the index to a grouped index according to a table.

7. The method of claim 1, wherein mapping comprises mapping the index to the grouped index according to a mathematical operation.

8. The method of claim 7, wherein mapping comprises mapping the index to the grouped index according to a divide-by-two operation.

9. The method of claim 1, wherein mapping comprises mapping the index to the grouped index according to a linear mapping.

10. The method of claim 1, wherein mapping comprises mapping the index to the grouped index according to a logarithmic mapping.

11. The method of claim 1, wherein mapping comprises mapping the index to the grouped index according to a piecewise nonlinear mapping.

12. The method of claim 1, wherein the plurality of probability states includes a highest probability state $p_0$, and wherein successive probability states are determined by multiplying a previous probability state with a parameter $\alpha$, wherein $\alpha$ is greater than 0.9493, and wherein $p_0$ is less than 0.5.

13. The method of claim 12, wherein $\alpha$ is approximately 0.9689 and wherein $p_0$ is approximately 0.493.

14. The method of claim 3, wherein the video coding process is a video encoding process, the method further comprising:
    encoding video data to produce residual data;
    transforming residual data to produce transform coefficients; and
    binarizing the transform coefficients to create the symbols.

15. The method of claim 3, wherein the video coding process is a video decoding process, wherein coding the symbol based on the grouped index and the probability state produces decoded bins, the method further comprising:
    receiving the symbols;
    reverse binarizing the decoded bins to produce transform coefficients;
    inverse transforming the transform coefficients to produce residual data; and
    decoding the residual data to produce decoded video data.

16. A non-transitory computer-readable storage medium storing instructions that, when executed, cause one or more processors of a device configured to perform entropy coding of video data using a binary arithmetic coding process in a video coding process to:
- determine a probability state of a symbol related to high definition (HD) video content in a binary arithmetic coding process, wherein the probability state is determined from a plurality of probability states for the HD video content, wherein a number of the plurality of probability states is greater than sixty-four (64), and wherein sixty-four (64) probability states represents a number of probability states used for video content having a resolution lower than the resolution associated with the HD video content; and
- map an index indicating the determined probability state to one of sixty-four (64) grouped indexes, wherein at least one of the grouped indexes represents at least two of the plurality of probability states, and wherein each of the sixty-four (64) grouped indexes identifies a range for a probability symbol in a table.

17. The non-transitory computer-readable storage medium of claim 16, wherein the number of the plurality of probability states is 128.

18. The non-transitory computer-readable storage medium of claim 16, further comprising instructions for causing the one or more processors to code the symbol based on the grouped index and the probability state.

19. The non-transitory computer-readable storage medium of claim 16, wherein the plurality of probability states includes a highest probability state $p_0$, and wherein successive probability states are determined by multiplying a previous probability state with a parameter $\alpha$, wherein $\alpha$ is greater than 0.9493, and wherein $p_0$ is less than 0.5.

20. The non-transitory computer-readable storage medium of claim 19, wherein $\alpha$ is approximately 0.9689 and wherein $p_0$ is approximately 0.493.

* * * * *